(12) United States Patent
Kodani

(10) Patent No.: US 10,177,012 B2
(45) Date of Patent: Jan. 8, 2019

(54) WIRING SUBSTRATE AND ELECTRONIC COMPONENT DEVICE

(71) Applicant: SHINKO ELECTRIC INDUSTRIES CO., LTD., Nagano-shi, Nagano (JP)

(72) Inventor: Kotaro Kodani, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 0 days.

(21) Appl. No.: 15/789,195

(22) Filed: Oct. 20, 2017

(65) Prior Publication Data

US 2018/0114702 A1 Apr. 26, 2018

(30) Foreign Application Priority Data

Oct. 24, 2016 (JP) .................. 2016-207497

(51) Int. Cl.
*H05K 7/10* (2006.01)
*H05K 7/12* (2006.01)
(Continued)

(52) U.S. Cl.
CPC ........ *H01L 21/4857* (2013.01); *H01L 21/481* (2013.01); *H01L 21/486* (2013.01); *H01L 23/49827* (2013.01); *H01L 23/49894* (2013.01); *H01L 23/544* (2013.01); *H01L 24/16* (2013.01); *H05K 1/0266* (2013.01); *H05K 1/0269* (2013.01); *H05K 1/111* (2013.01); *H05K 3/4007* (2013.01); *H05K 3/4682* (2013.01); *H01L 21/6835* (2013.01); *H01L 2221/68345* (2013.01); *H01L 2223/54406* (2013.01); *H01L 2223/54426* (2013.01);
(Continued)

(58) Field of Classification Search
CPC . H01L 21/481; H01L 21/4857; H01L 21/486; H01L 21/6835; H01L 2221/68345; H01L 2223/54406; H01L 2223/54426; H01L 2224/16227; H01L 2224/16235; H01L 23/49827; H01L 23/49894; H01L 23/544
See application file for complete search history.

(56) References Cited

U.S. PATENT DOCUMENTS 5,512,712 A * 4/1996 Iwata .................. H05K 1/0266
174/250
2008/0245549 A1* 10/2008 Kodani ................. H05K 3/205
174/126.1
(Continued)

FOREIGN PATENT DOCUMENTS

JP 2015-002227 1/2015
JP 2015-170808 9/2015

*Primary Examiner* — Yuriy Semenenko
(74) *Attorney, Agent, or Firm* — Rankin, Hill & Clark LLP

(57) ABSTRACT

A wiring substrate includes a first insulation layer having a component mounting area and a mark formation area, an electrode pad arranged in the component mounting area and having an upper surface exposed from the first insulation layer and a side surface and a lower surface embedded in the first insulation layer, and a mark arranged in the mark formation area and formed of an insulation pattern layer having an upper surface exposed from the first insulation layer and a side surface and a lower surface embedded in the first insulation layer. A color of the first insulation layer and a color of the insulation pattern layer are different.

6 Claims, 28 Drawing Sheets

(51) Int. Cl.
*H01L 21/48* (2006.01)
*H01L 23/498* (2006.01)
*H01L 23/544* (2006.01)
*H01L 23/00* (2006.01)
*H05K 1/02* (2006.01)
*H05K 1/11* (2006.01)
*H05K 3/40* (2006.01)
*H05K 3/46* (2006.01)
*H01L 21/683* (2006.01)
*H05K 1/18* (2006.01)

(52) U.S. Cl.
CPC .............. *H01L 2224/16227* (2013.01); *H01L 2224/16235* (2013.01); *H05K 1/181* (2013.01); *H05K 2201/09909* (2013.01); *H05K 2201/09918* (2013.01); *H05K 2201/09936* (2013.01)

(56) References Cited

U.S. PATENT DOCUMENTS

| | | | | |
|---|---|---|---|---|
| 2012/0112370 | A1* | 5/2012 | Kobayashi | H01L 23/544 |
| | | | | 257/797 |
| 2014/0065793 | A1* | 3/2014 | Kang | H01L 21/027 |
| | | | | 438/401 |
| 2015/0257256 | A1* | 9/2015 | Sato | H05K 1/0269 |
| | | | | 257/774 |
| 2016/0172306 | A1* | 6/2016 | Scanlan | H01L 21/561 |
| | | | | 438/462 |
| 2017/0047293 | A1* | 2/2017 | Moon, III | H01L 23/544 |

* cited by examiner

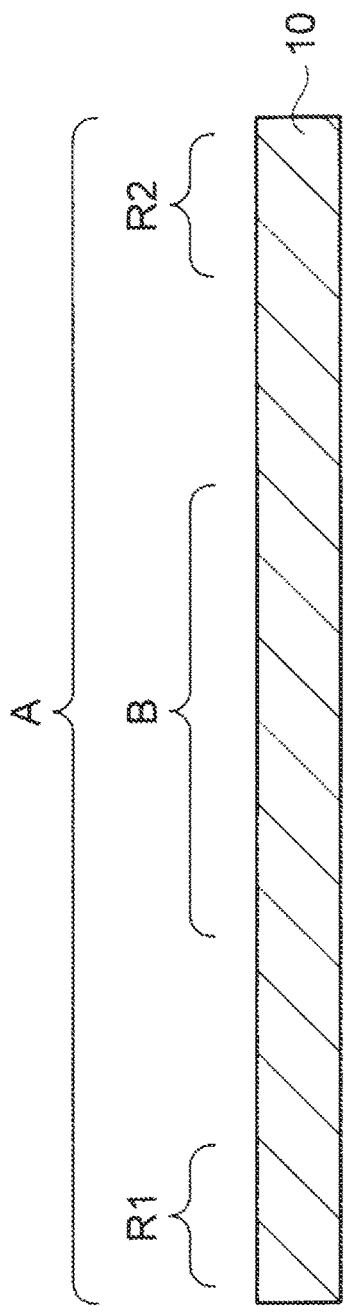
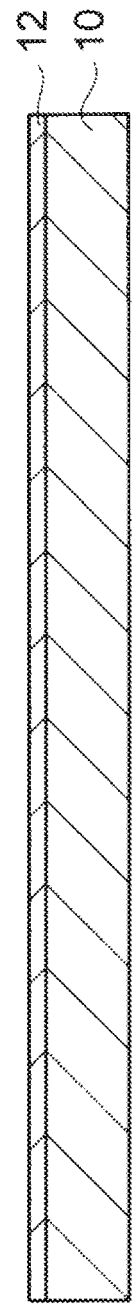
FIG. 1A
FIG. 1B

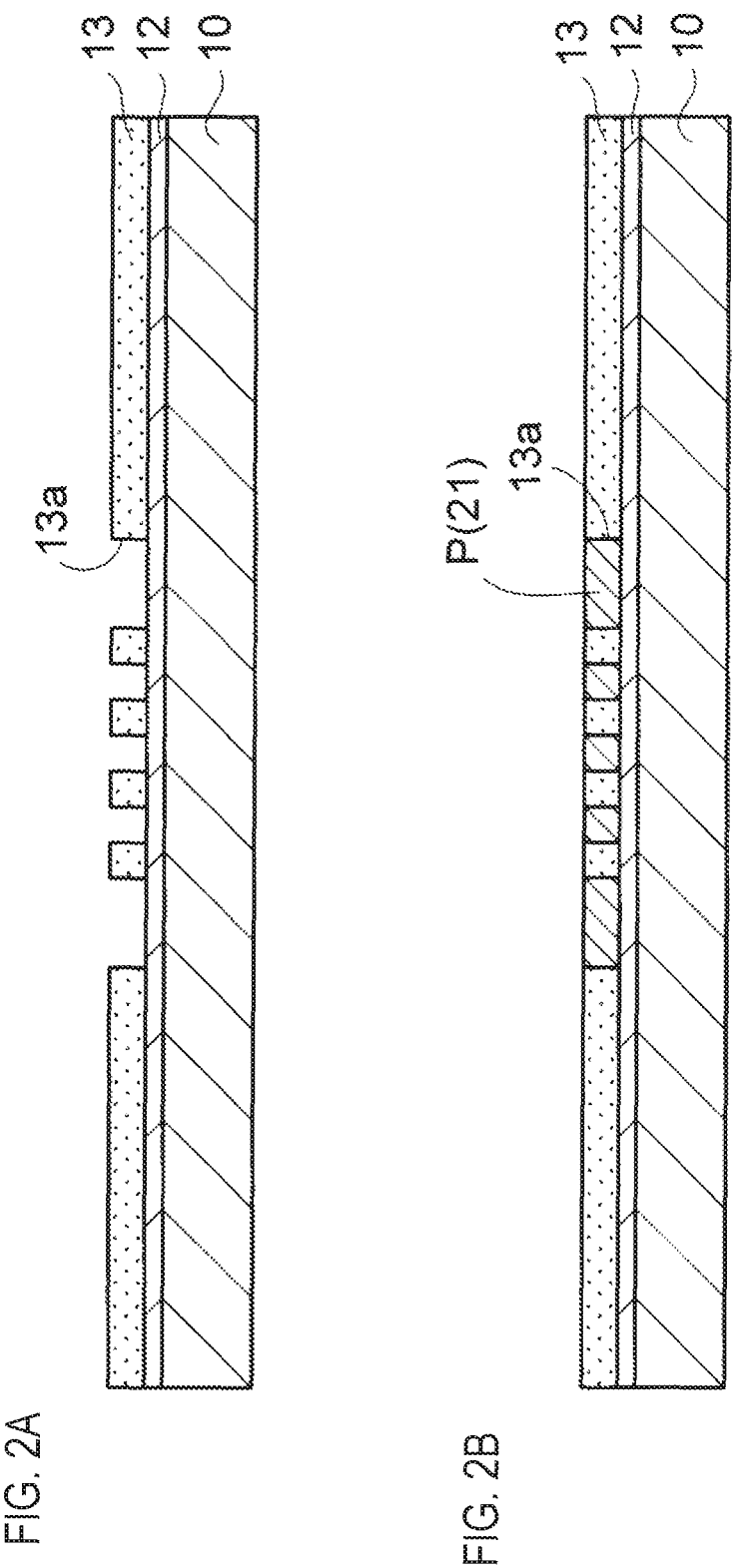

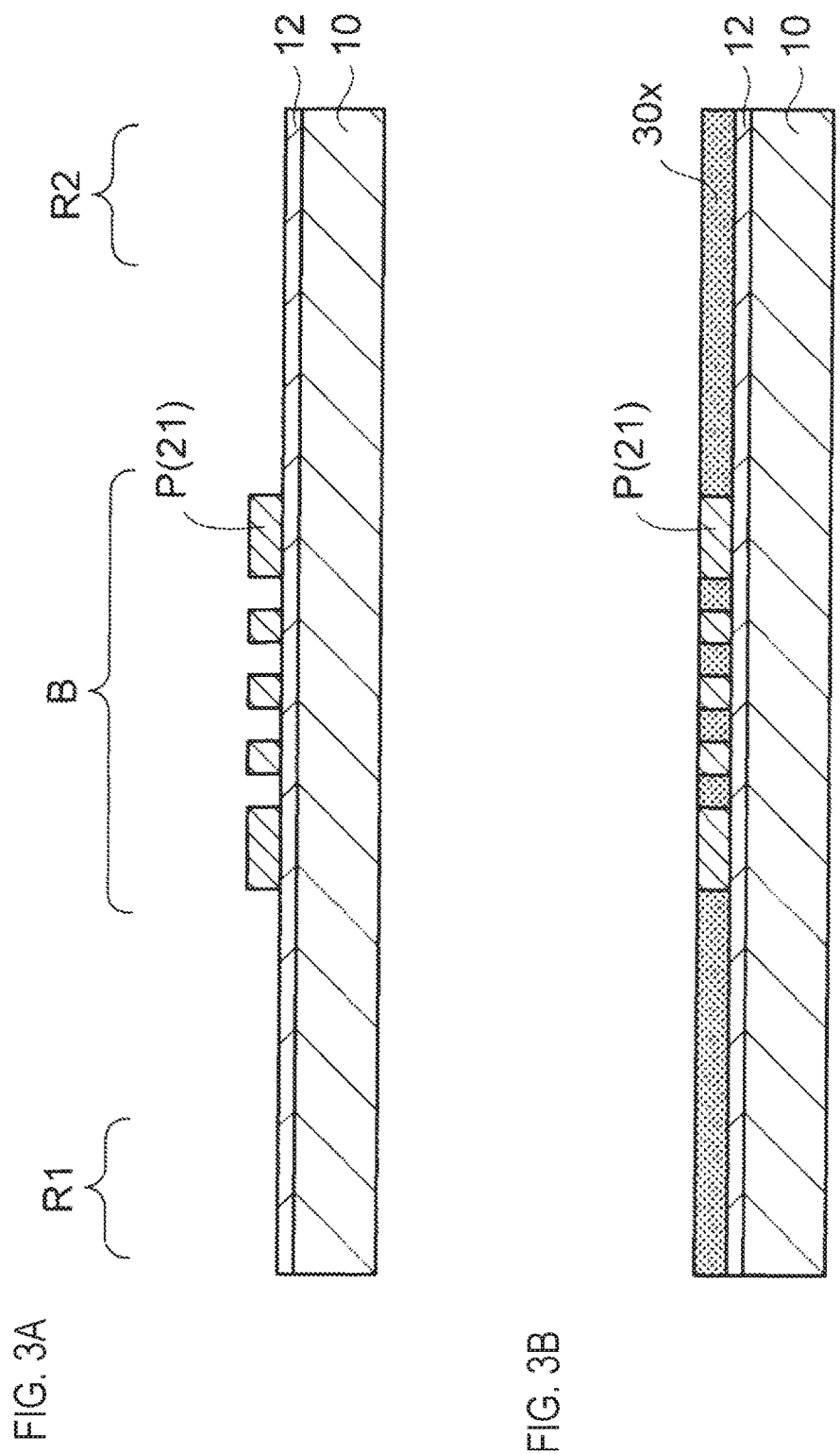

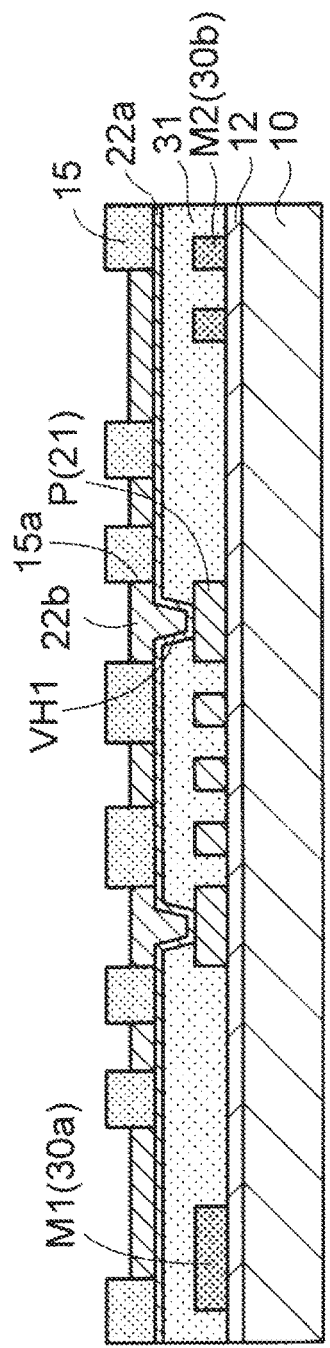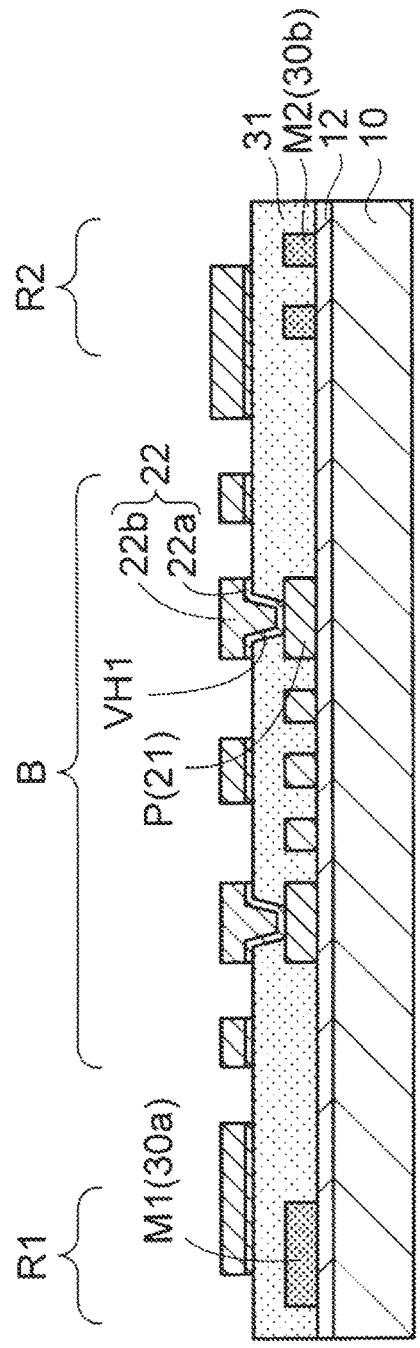

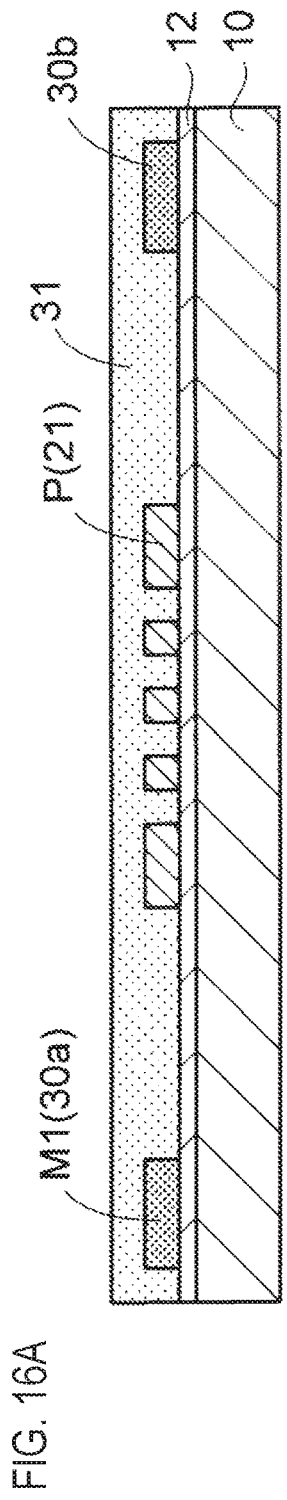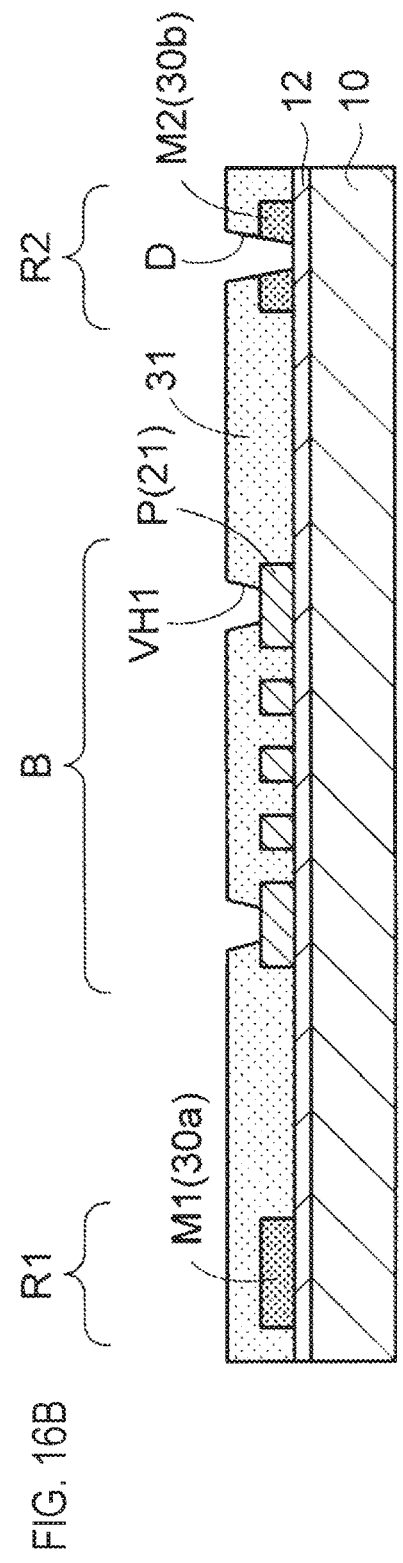

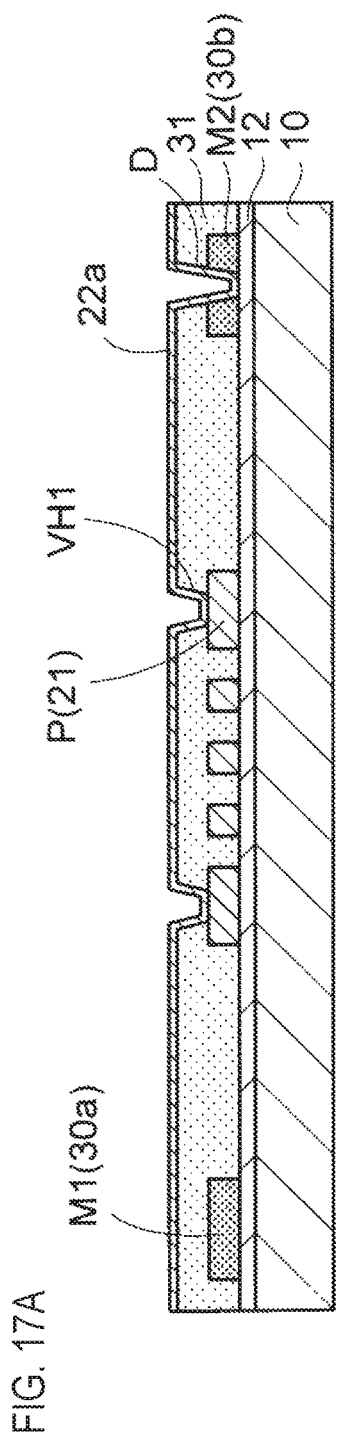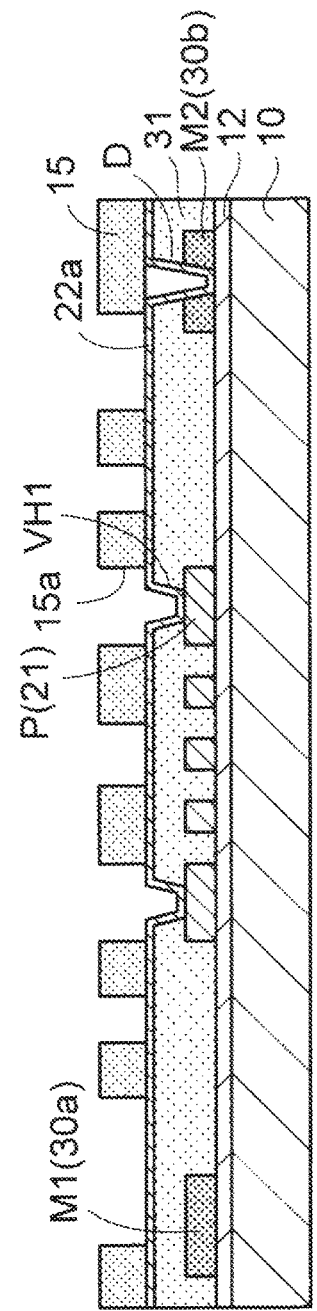

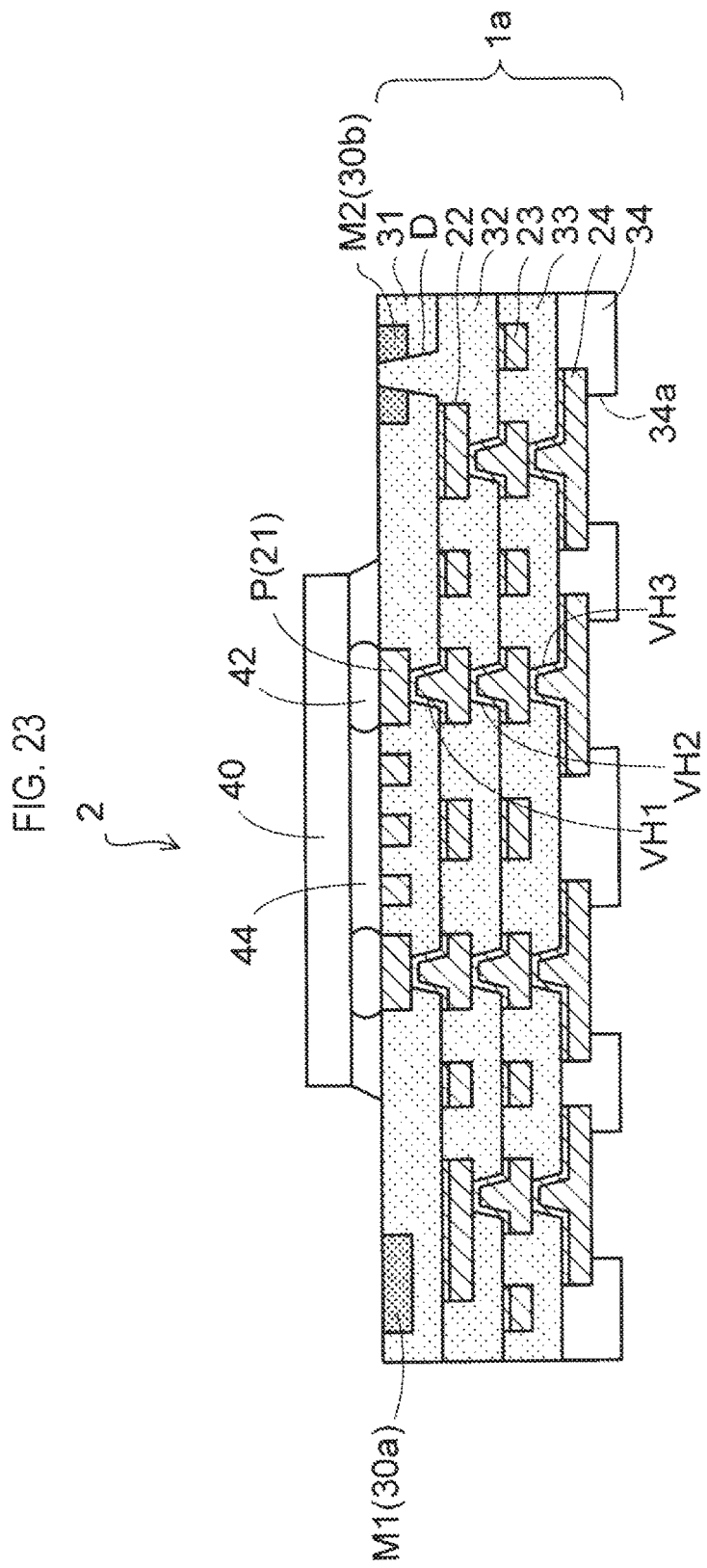

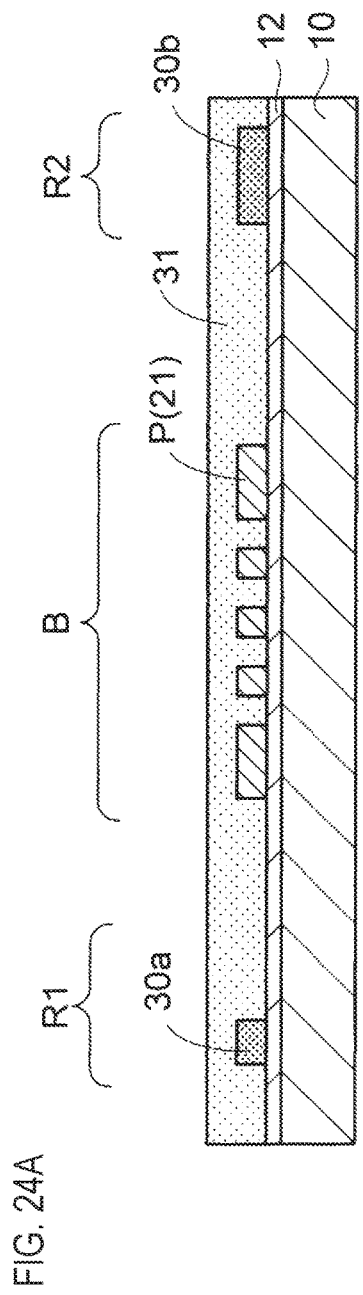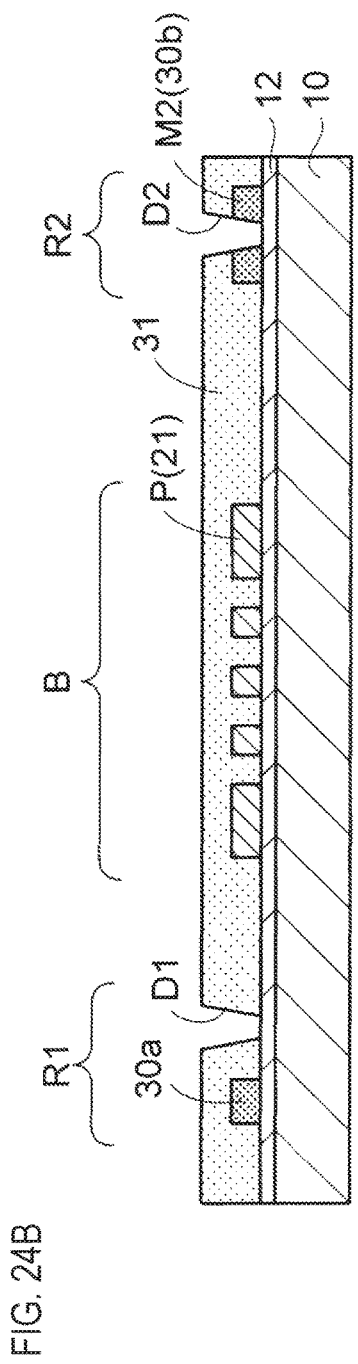

WIRING SUBSTRATE AND ELECTRONIC COMPONENT DEVICE

CROSS-REFERENCE TO RELATED APPLICATION

The present application claims priority from Japanese Patent Application No. 2016-207497 filed on Oct. 24, 2016, the entire content of which is incorporated herein by reference.

BACKGROUND

Technical Field

The present invention relates to a wiring substrate and an electronic component device.

In the related art, a wiring substrate for mounting thereon electronic components such as semiconductor chips and the like has been known. As an example of the wiring substrate, a coreless wiring substrate has been known in which electrode pads and a build-up wiring layer connected to the electrode pads are formed on a support plate and the support plate is then removed to expose the electrode pads.

Patent Document 1: JP-A-2015-2227
Patent Document 2: JP-A-2015-170808

In an example of the coreless wiring substrate, various marks for alignment, identification and the like are formed with being exposed in a mark formation area outside a component mounting area in which the electrode pads are exposed.

However, when a mark is formed by the same layer as the electrode pad or a via-conductor, a wiring layer for establishing an electric circuit cannot be arranged in an area of an insulation layer in which the mark is embedded, so that a circuit design of the wiring substrate is limited.

Also, according to the method of forming the mark by the same layer as the electrode pad or via-conductor, when manufacturing a wiring substrate of a different type, if a metal material of a surface of the wiring substrate is changed, a color tone is changed, so that it is necessary to perform a troublesome adjustment operation for an image recognition device, in each case.

SUMMARY

Exemplary embodiments of the invention provide a wiring substrate having a novel structure capable of arranging a wiring layer in an area of an insulation layer in which a mark is formed and keeping a color tone of the mark unchanged even if a product type is different, and an electronic component device.

A wiring substrate according to an exemplary embodiment, comprises:

a first insulation layer having a component mounting area and a mark formation area;

an electrode pad arranged in the component mounting area and having an upper surface exposed from the first insulation layer and a side surface and a lower surface embedded in the first insulation layer; and a mark arranged in the mark formation area and formed of an insulation pattern layer having an upper surface exposed from the first insulation layer and a side surface and a lower surface embedded in the first insulation layer, wherein a color of the first insulation layer and a color of the insulation pattern layer are different.

A manufacturing method of a wiring substrate, according to an exemplary embodiment, the method comprises:

preparing a metal plate for which a component mounting area and a mark formation area are defined;

forming an electrode pad in the component mounting area on the metal plate;

forming a mark by arranging an insulation pattern layer in the mark formation area on the metal plate;

forming a first insulation layer covering the electrode pad and the mark on the metal plate; and removing the metal plate, wherein a color of the first insulation layer and a color of the insulation pattern layer are different.

According to the following present invention, the first insulation layer of the wiring substrate has the component mounting area and the mark formation area. In the component mounting area of the first insulation layer, the electrode pad of which the upper surface is exposed from the first insulation layer and the side surface and lower surface are embedded in the first insulation layer is formed.

Also, in the mark formation area of the first insulation layer, the mark formed by the insulation pattern layer of which the upper surface is exposed from the first insulation layer and the side surface and lower surface are embedded in the first insulation layer is arranged. The color of the first insulation layer and the color of the insulation pattern layer are different.

In this way, the mark formed of the insulating material is embedded to be recognizable in the first insulation layer arranged as the outermost layer of the wiring substrate.

Thereby, it is possible to arrange the wiring layer for establishing an electric circuit on the lower surface of the first insulation layer in the mark formation area. Therefore, a circuit design of the wiring substrate is not limited, and it is possible to improve a degree of freedom of the circuit design.

Also, since the mark is formed by the insulation pattern layer having a predetermined color, the color tone is not changed depending on the type of the wiring substrate, and it is possible to stably recognize various marks by an image recognition device.

BRIEF DESCRIPTION OF THE DRAWINGS

FIGS. 1A and 1B are sectional views depicting a manufacturing method of a wiring substrate of a first exemplary embodiment (1 thereof).

FIGS. 2A and 2B are sectional views depicting the manufacturing method of the wiring substrate of the first exemplary embodiment (2 thereof).

FIGS. 3A and 3B are sectional views depicting the manufacturing method of the wiring substrate of the first exemplary embodiment (3 thereof).

FIGS. 7A and 7B are sectional views depicting the manufacturing method of the wiring substrate of the first exemplary embodiment (7 thereof).

FIGS. 16A and 16B are sectional views depicting the manufacturing method of the wiring substrate of the second exemplary embodiment (2 thereof).

FIGS. 17A and 17B are sectional views depicting the manufacturing method of the wiring substrate of the second exemplary embodiment (3 thereof).

FIG. 23 is a sectional view depicting an electronic component device of the second exemplary embodiment.

FIGS. 24A and 24B are sectional views depicting a manufacturing method of a wiring substrate of a third exemplary embodiment (1 thereof).

DETAILED DESCRIPTION

Hereinafter, exemplary embodiments will be described with reference to the accompanying drawings.

(First Exemplary Embodiment)

Figure 9:
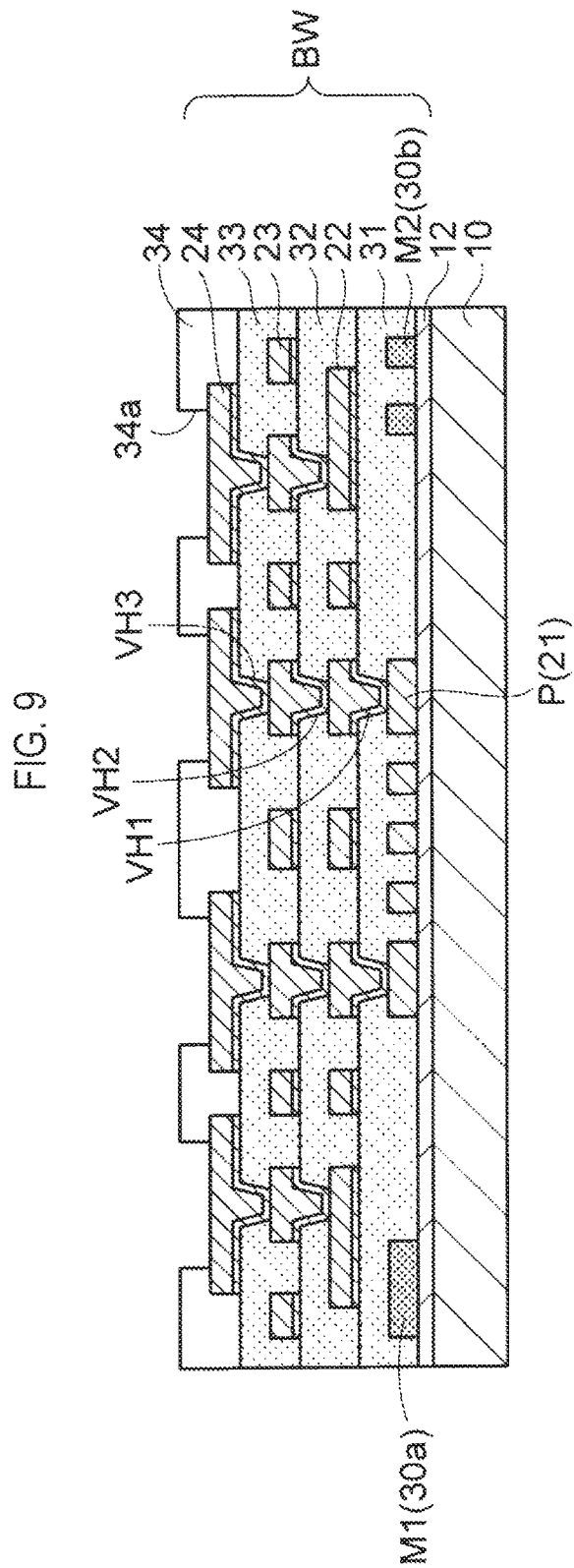
FIG. 9 is a sectional view depicting the manufacturing method of the wiring substrate of the first exemplary embodiment (9 thereof).
Figure 10:
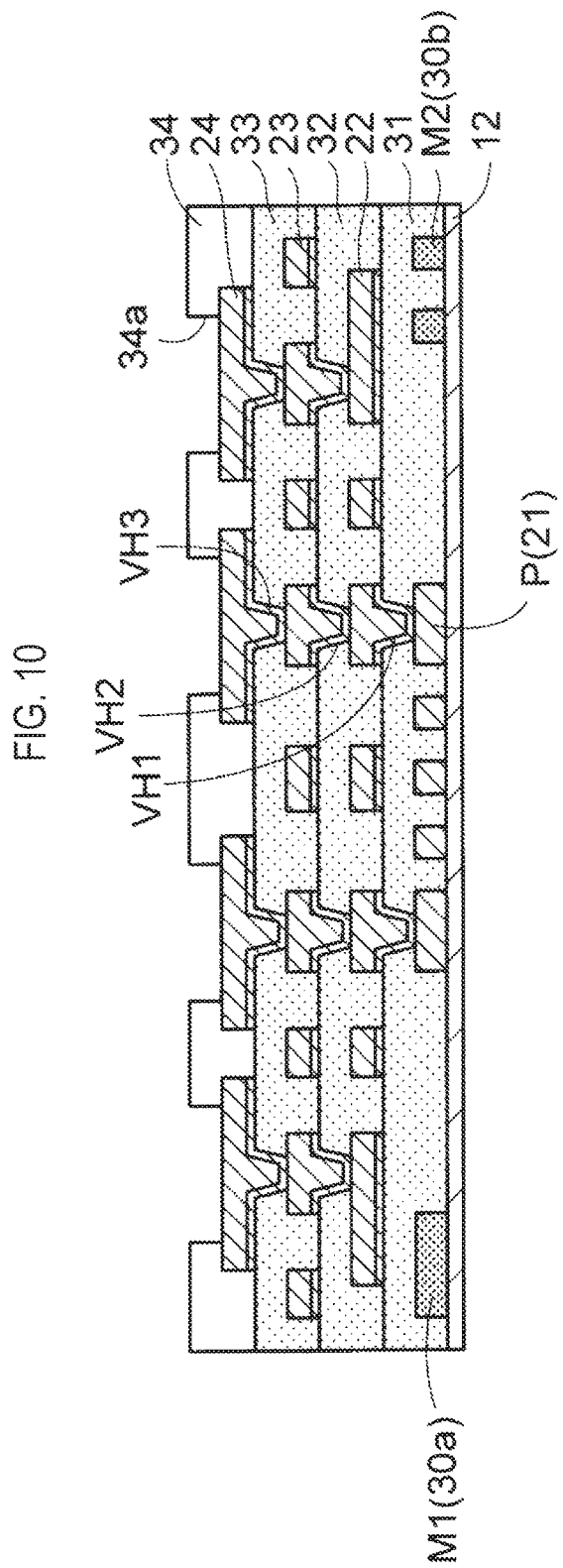
FIG. 10 is a sectional view depicting the manufacturing method of the wiring substrate of the first exemplary embodiment (10 thereof).
Figure 11:
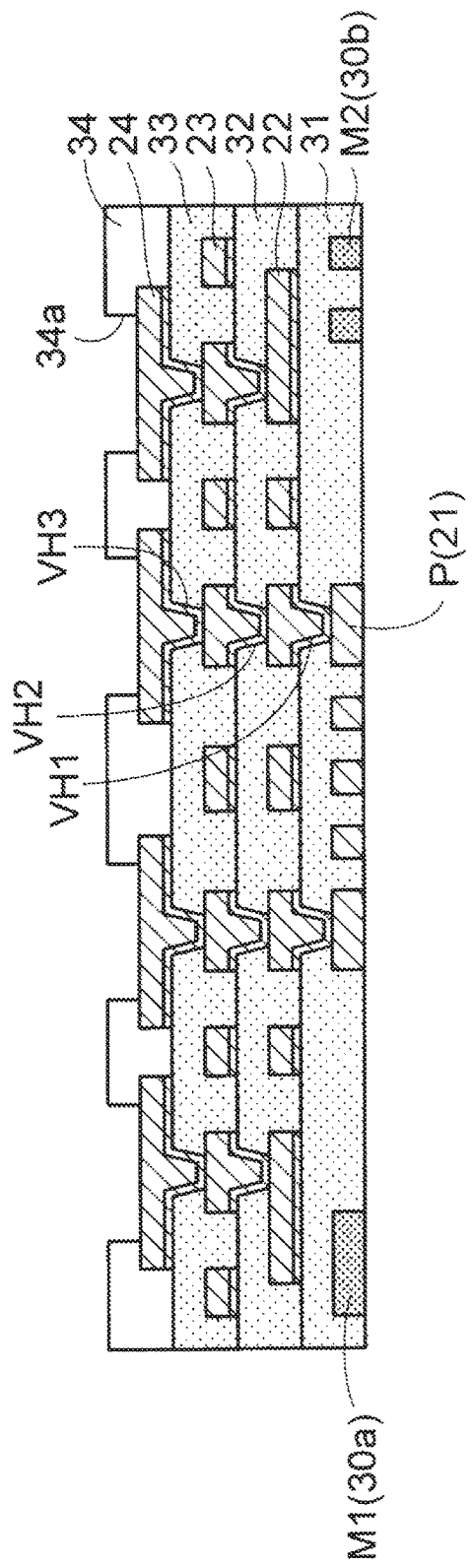
FIG. 11 is a sectional view depicting a wiring substrate of the first exemplary embodiment (1 thereof).
Figure 12:
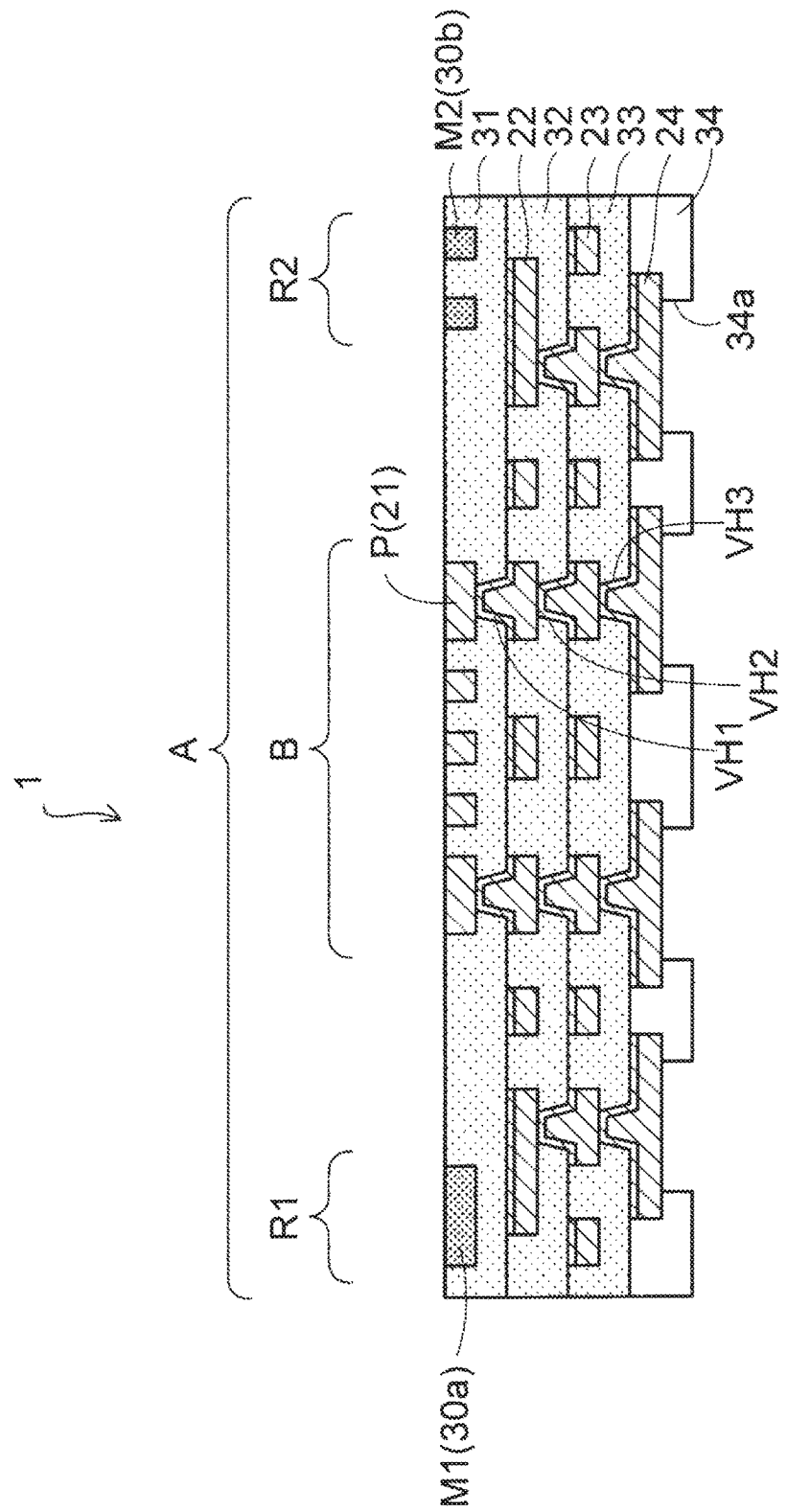
FIG. 12 is a sectional view depicting the wiring substrate of the first exemplary embodiment (2 thereof).
Figure 13:
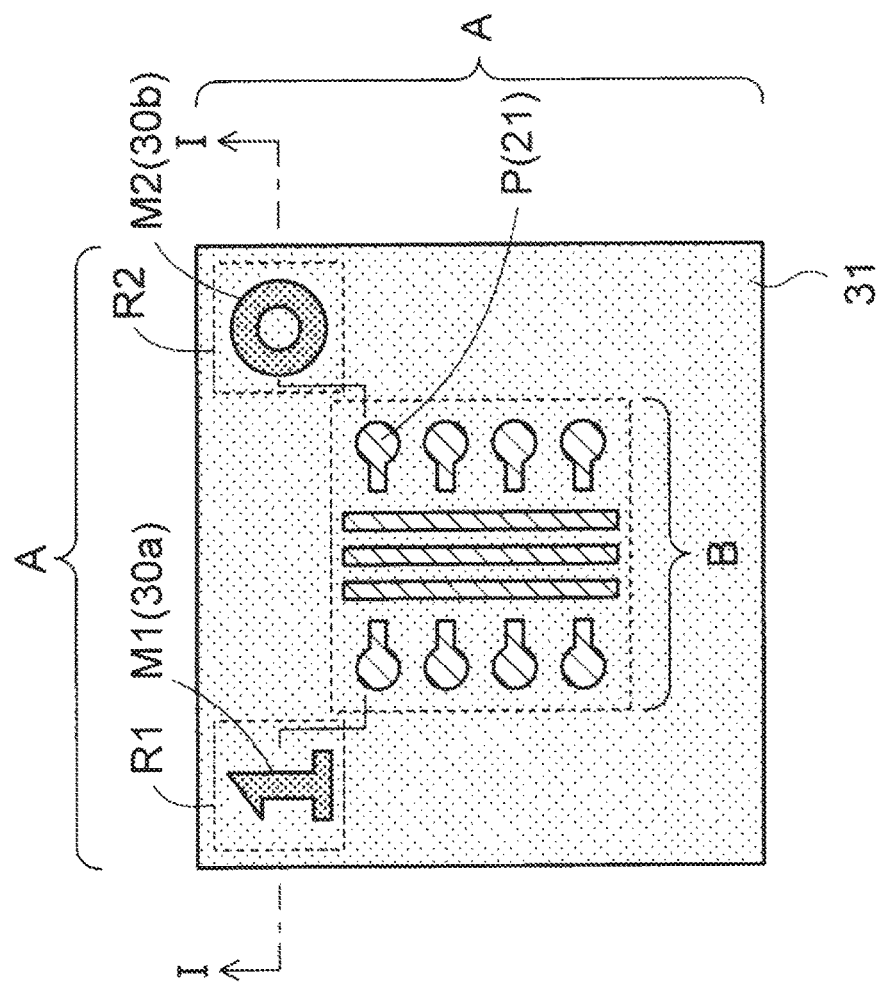
FIG. 13 is a reduced plan view of the wiring substrate shown in FIG. 12, as seen from above.
Figure 14:
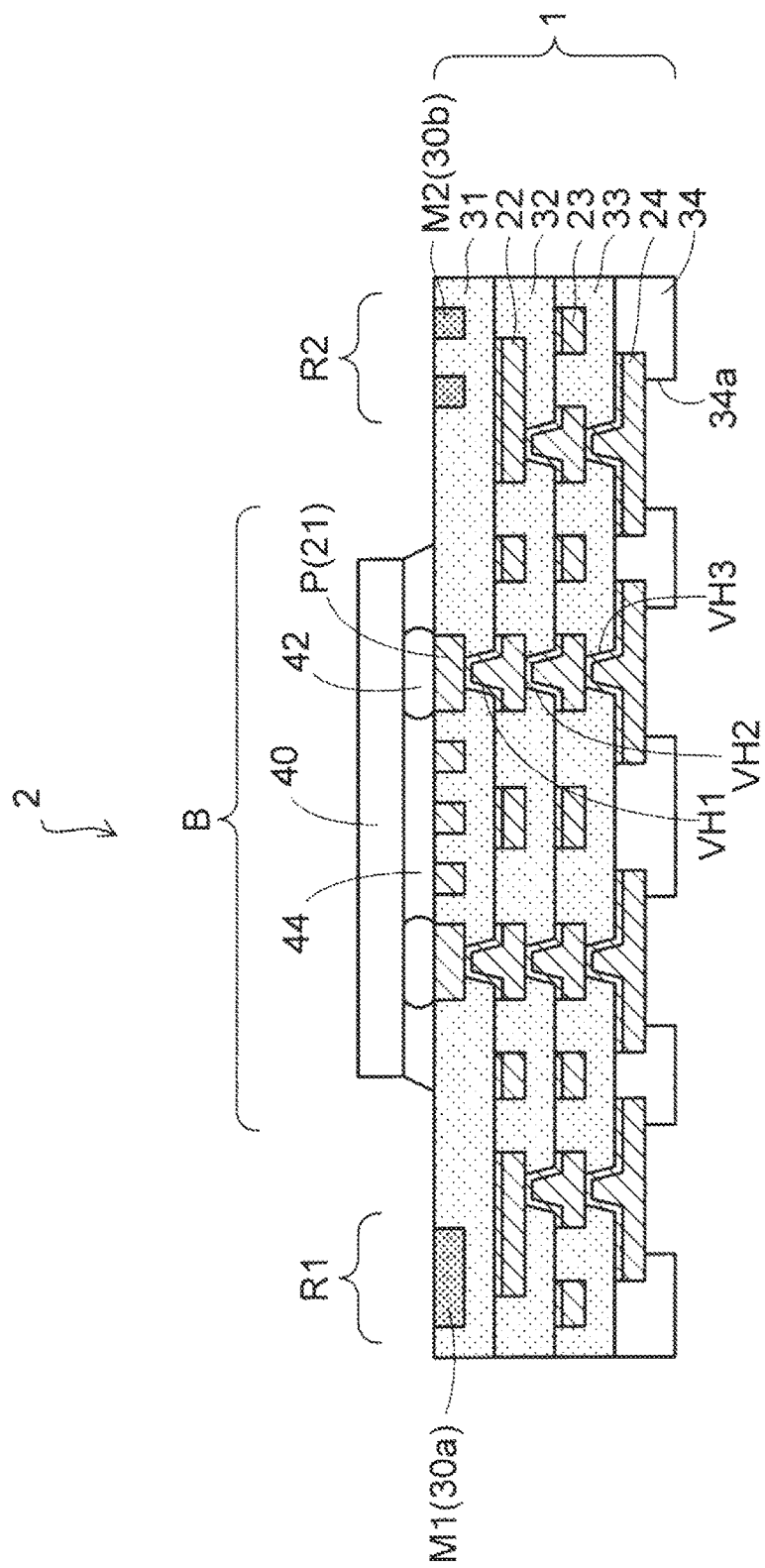
FIG. 14 is a sectional view depicting an electronic component device of the first exemplary embodiment.

FIGS. 1A to 10 illustrate a manufacturing method of a wiring substrate of a first exemplary embodiment, FIGS. 11 to 13 illustrate a wiring substrate of the first exemplary embodiment, and FIG. 14 depicts an electronic component device of the first exemplary embodiment.

In the below, structures of the wiring substrate and the electronic component device are described while describing the manufacturing method of the wiring substrate.

In the manufacturing method of the wiring substrate of the first exemplary embodiment, a metal plate 10 having a thickness of 20 μm to 100 μm is first prepared, as shown in FIG. 1A. The metal plate 10 is used as a support plate for manufacturing a coreless wiring substrate, and is finally removed. As the metal plate 10, a steel plate is preferably used.

For the metal plate 10, a plurality of product areas A is defined, and a component mounting area B, a first mark formation area R1 and a second mark formation area R2 are defined in each product area A. In FIG. 1A, one product area A is partially shown.

Then, as shown in FIG. 1B, a nickel layer 12 having a thickness of 1 μm to 3 μm is formed on an entire upper surface of the metal plate 10 by an electrolytic plating method in which the metal plate 10 is used as a plating power feeding path. Alternatively, the nickel layer 12 may be formed using a sputtering method. The nickel layer 12 is used as an etching stop layer when finally removing the metal plate 10.

Subsequently, as shown in FIG. 2A, a plated resist layer 13 having an opening 13a is formed on the metal plate 10 by photolithography.

Also, as shown in FIG. 2B, a metal plated layer is formed on the nickel layer 12 in the opening 13a of the plated resist layer 13 by the electrolytic plating method in which the metal plate 10 is used as a plating power feeding path. Thereby, electrode pads P serving as a first wiring layer 21 are formed.

Thereafter, as shown in FIG. 3A, the plated resist layer 13 is removed from the metal plate 10. In this way, the electrode pads P are formed in the component mounting area B on the metal plate 10. The electrode pad P may be coupled to one end of a lead wiring or may be formed as an island-shaped pad. The electrode pad P is formed of copper or the like. A thickness of the electrode pad P is set to 10 μm to 25 μm, for example.

Subsequently, as shown in FIG. 3B, a photosensitive insulating resin layer 30x having the same thickness as the electrode pad P is formed on the metal plate 10. The photosensitive insulating resin layer 30x may be formed by bonding a resin film or applying a liquid resin.

The photosensitive insulating resin layer 30x is formed of an insulating resin, which includes dyestuff, and has a predetermined color. As an example of the photosensitive insulating resin layer 30x, a green, red, blue or black solder resist layer is favorably used.

Figure 4A:
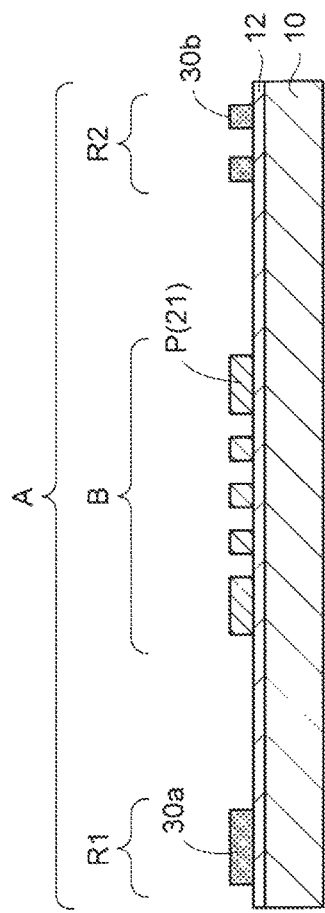
FIGS. 4A and 4B are a sectional view and a plan view depicting the manufacturing method of the wiring substrate of the first exemplary embodiment (4 thereof).

Then, as shown in FIG. 4A, the photosensitive insulating resin layer 30x is exposed and developed via a photomask (not shown) by photolithography, so that a first insulation pattern layer 30a and a second insulation pattern layer 30b are formed.

Figure 4B:
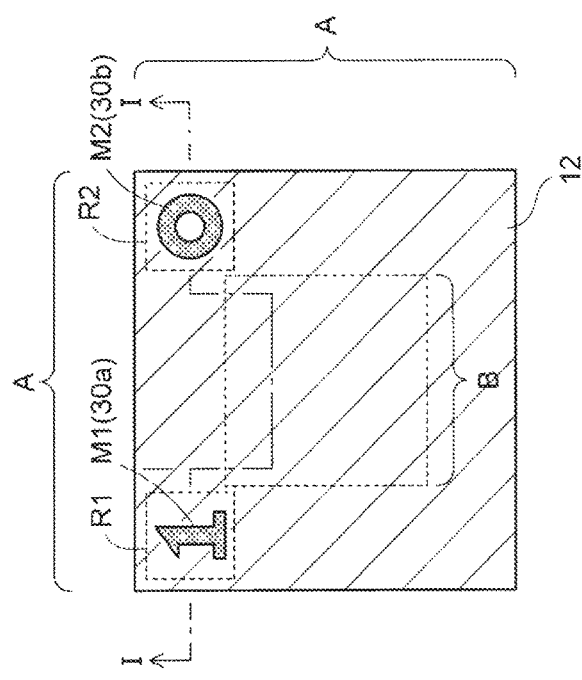

As shown in a reduced plan view of FIG. 4B, a first mark M1 formed of the first insulation pattern layer 30a is arranged in the first mark formation area R1 defined at a left and upper corner portion of the rectangular product area A. Also, a second mark M2 formed of the second insulation pattern layer 30b is arranged in the second mark formation area R2 defined at a right and upper corner portion of the rectangular product area A.

In the example of FIG. 4B, as seen from a plan view, for the first mark M1, a number "1" is arranged as an identification number, and for the second mark M2, "◎" is arranged as an alignment mark. Also, the component mounting area B, in which a semiconductor chip is to be mounted, is defined at a central part of the product area A.

A sectional view of FIG. 4A corresponds to a section taken along a line I-I of the plan view of FIG. 4B. In FIG. 4B, the electrode pads P are omitted.

The photosensitive insulating resin layer 30x is patterned to form the first and second insulation pattern layers 30a, 30b on the basis of the photolithography, so that it is possible to make various marks such as a number, a character, a symbol, a figure, a two-dimensional barcode and the like.

Alternatively, an insulation resin, which includes dyestuff, may be patterned to form a mark by a screen printing or the like.

Figure 5A:
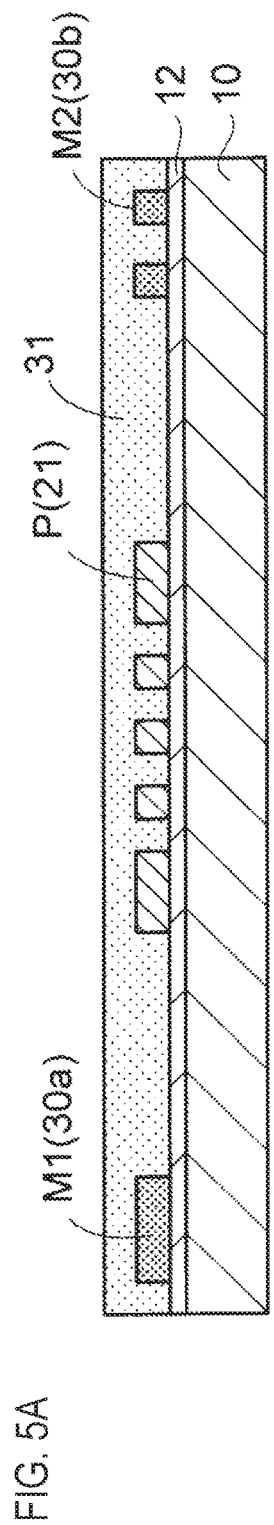
FIGS. 5A and 5B are sectional views depicting the manufacturing method of the wiring substrate of the first exemplary embodiment (5 thereof).

Then, as shown in FIG. 5A, a first insulation layer 31 covering the electrode pads P, the first mark M1 and the second mark M2 is formed on the metal plate 10. The first insulation layer 31 is formed by hot pressing, heating and curing an uncured resin film on the metal plate 10.

Thicknesses of the first mark M1 and the second mark M2 are set to be the same as the thickness of the electrode pad P, so that it is possible to easily flatten an upper surface of the first insulation layer 31.

The first insulation layer 31 is formed of an insulating resin such as an epoxy resin or the like, which does not include dyestuff. The first insulation layer 31 has a color different from the color of the first mark M1 and second mark M2. For example, the first insulation layer 31 has a white, cream or transparent color.

Thereby, as described later, when the metal plate 10 and the nickel layer 12 are removed, the first mark M1 and the second mark M2 are exposed from the first insulation layer 31. At this time, since the color of the first mark M1 and second mark M2 and the color of and the first insulation layer 31 are different, it is possible to recognize the first mark M1 and the second mark M2 with naked eyes or via a microscope or the like.

In the first exemplary embodiment, the first and second insulation pattern layers 30a, 30b having a color different from the color of the first insulation layer 31 are exposed from the first insulation layer 31, so that the first and second marks M1, M2 are established. For this reason, even when a wiring substrate of a different type is manufactured, it is not necessary to replace the material of the insulation pattern layer becoming the marks and the color tone of the marks is not changed. As a result, it is not necessary to perform a troublesome adjustment operation for an image recognition device.

Differently from the first exemplary embodiment, in a method of forming a mark by the same layer as the electrode pads, when a metal material of the surfaces of the electrode pads is changed upon manufacturing of a wiring substrate of a different type, the color tone of the mark is changed.

Figure 5B:
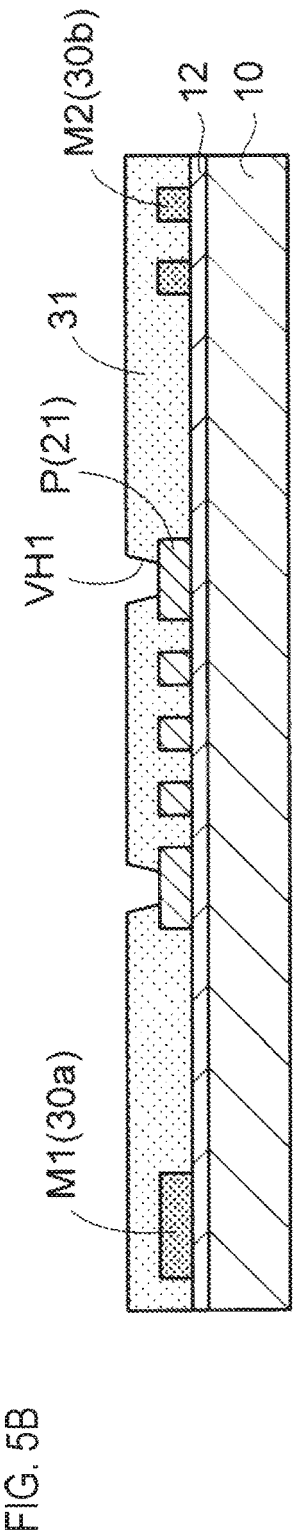

Subsequently, as shown in FIG. 5B, the first insulation layer 31 is subjected to laser processing, so that first via-holes VH1 reaching the electrode pads P are formed.

Figure 6A:
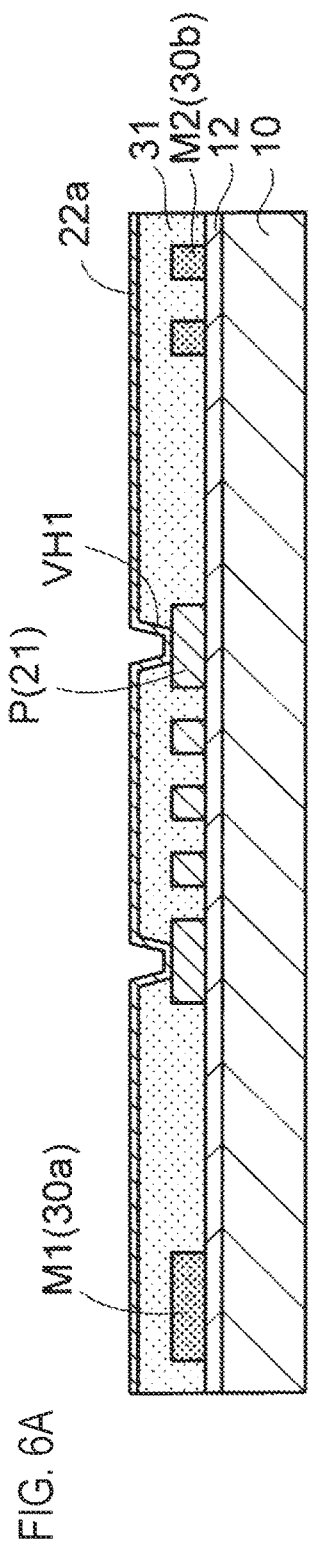
FIGS. 6A and 6B are sectional views depicting the manufacturing method of the wiring substrate of the first exemplary embodiment (6 thereof).

Also, as shown in FIG. 6A, a seed layer 22a is formed on inner walls of the first via-holes VH1 and on the first insulation layer 31 by an electroless plating method or a sputtering method.

Figure 6B:
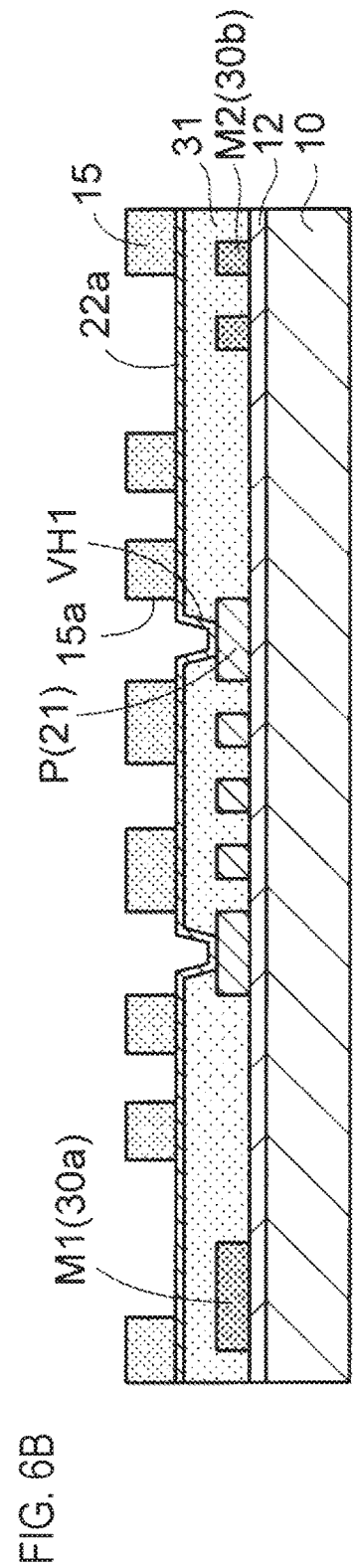

Also, as shown in FIG. 6B, a plated resist layer 15 having openings 15a provided in an area in which a second wiring layer is to be arranged is formed.

Then, as shown in FIG. 7A, a metal plated layer 22b is formed so as to fill the first via-holes VH1 and the openings 15a of the plated resist layer 15 by an electrolytic plating method in which the seed layer 22a is used as a plating power feeding path. The seed layer 22a and the metal plated layer 22b are formed of copper or the like.

Also, as shown in FIG. 7B, the plated resist layer 15 is removed, and the seed layer 22a is then etched using the metal plated layer 22b as a mask.

By the above processes, a second wiring layer 22 is formed on the first insulation layer 31 by the seed layer 22a and the metal plated layer 22b.

In the first exemplary embodiment, the first and second marks M1, M2 are formed by the first and second insulation pattern layers 30a, 30b embedded in the first insulation layer 31. For this reason, it is possible to arrange the second wiring layer 22 not only in the component mounting area B but also in the first and second mark formation areas R1, R2.

Figure 8:
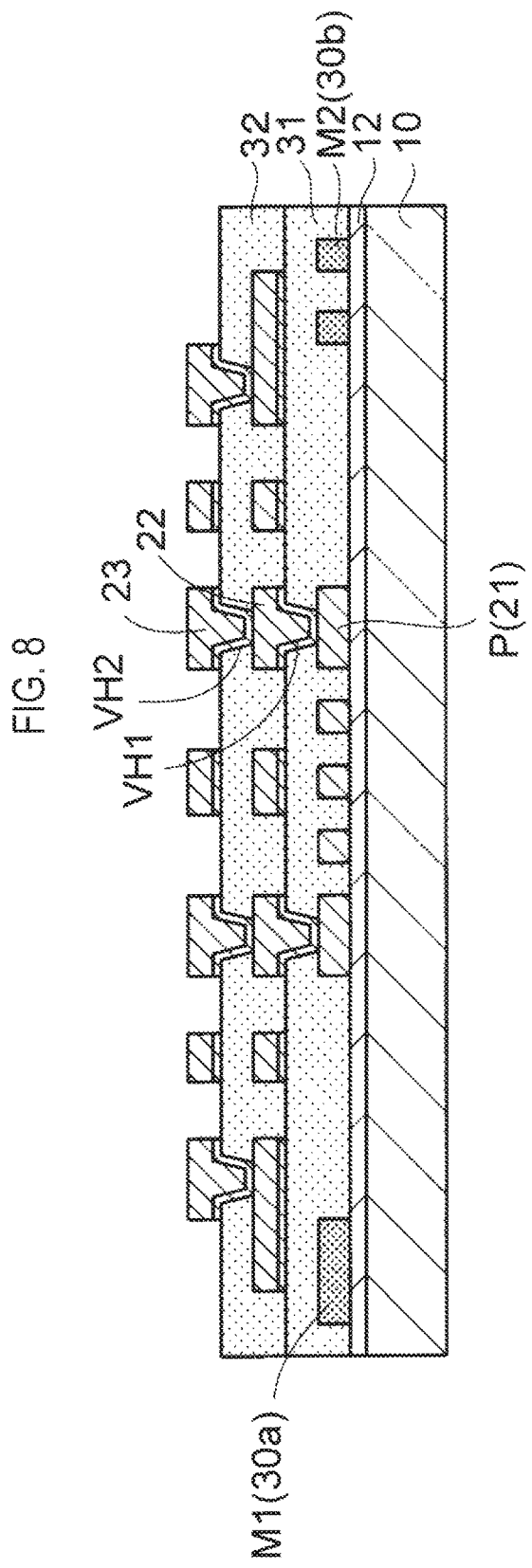
FIG. 8 is a sectional view depicting the manufacturing method of the wiring substrate of the first exemplary embodiment (8 thereof).

Subsequently, as shown in FIG. 8, the processes similar to the respective formation processes of the first insulation layer 31, the first via-hole VH1 and the second wiring layer 22 are repeated.

Thereby, a second insulation layer 32 having second via-holes VH2 arranged on connection portions of the second wiring layer 22 is formed on the first insulation layer 31. Also, a third wiring layer 23 connected to the second wiring layer 22 through via-conductors in the second via-holes VH2 is formed on the second insulation layer 32.

Also, likewise, as shown in FIG. 9, the processes similar to the respective formation processes of the first insulation layer 31, the first via-hole VH1 and the second wiring layer 22 are repeated.

Thereby, a third insulation layer 33 having third via-holes VH3 arranged on connection portions of the third wiring layer 23 is formed on the second insulation layer 32. Also, a fourth wiring layer 24 connected to the third wiring layer 23 through via-conductors in the third via-holes VH3 is formed on the third insulation layer 33.

Also, a protective insulation layer 34 having openings 34a formed on connection portions of the fourth wiring layer 24 is formed. As the protective insulation layer 34, a solder resist layer or the like is used.

By the above processes, a four-layered build-up wiring layer BW including the electrode pads P at the lowest layer is formed on the metal plate 10 with the nickel layer 12 being interposed therebetween.

Then, as shown in FIG. 10, the metal plate 10 is removed by wet etching.

When the metal plate 10 is formed of copper, an ammonium chloride solution is used as an etching solution.

At this time, the nickel layer 12 arranged at an inner surface-side of the metal plate 10 functions as an etching stop layer without being etched by the ammonium chloride solution, and remains below the build-up wiring layer BW.

Then, as shown in FIG. 11, the left nickel layer 12 is wet etched and removed by a mixed solution of nitric acid and hydrogen peroxide. Thereby, the electrode pads P, the first mark M1 and the second mark M2 are exposed from an outer surface of the first insulation layer 31.

Since the electrode pads P (copper) are not etched by the mixed solution of nitric acid and hydrogen peroxide, the outer surfaces of the electrode pads P and the outer surface of the first insulation layer 31 are exposed with being flush with each other.

Alternatively, the nickel layer 12 may be omitted in FIG. 1B. In this case, since the etching stop layer does not exist in the process of FIG. 10, the electrode pads P (copper) are a little etched in FIG. 11, so that the outer surfaces of the electrode pads P are recessed from the outer surface of the first insulation layer 31 and concave portions are thus formed.

By the above processes, a wiring substrate 1 of the first exemplary embodiment is manufactured as shown in FIG. 11. In the wiring substrate 1 of the first exemplary embodiment shown in FIG. 11, the electrode pads P exposed to the lower surface-side are used as connection portions to which an electronic component is to be connected, and connection portions of the fourth wiring layer 24 exposed to the upper surface-side are used as external connection terminals to be connected to a motherboard, or the like.

FIG. 12 depicts a state where the wiring substrate 1 of FIG. 11 is reversed in an upper and lower direction. After an electronic component is mounted in the component mounting area B of each product area A of the wiring substrate 1 of FIG. 12, the wiring substrate is cut so as to obtain each product area A. Alternatively, the wiring substrate may be cut before mounting the electronic components.

As shown in FIG. 12, in the wiring substrate 1 of the first exemplary embodiment, the first insulation layer 31 is arranged as the outermost layer. The first insulation layer 31 has the component mounting area B at a central portion thereof and the first and second mark formation areas R1, R2 at peripheral edge portions. The electrode pads P formed as the first wiring layer 21 are embedded in the first insulation layer 31. The side surfaces and lower surfaces of the electrode pads P are embedded in the first insulation layer 31 with the upper surfaces of the electrode pads P being exposed from the first insulation layer 31.

The upper surfaces of the electrode pads P and the upper surface of the first insulation layer 31 are arranged at the same height with being flush with each other. The electrode pads P are embedded up to a middle portion in a thickness direction of the first insulation layer 31, and the first insulation layer 31 exists at a lower side of the electrode pads P.

Also, the first mark M1 formed by the first insulation pattern layer 30a is arranged in the first mark formation area R1 of one corner portion of the wiring substrate 1. Also, the second mark M2 formed by the second insulation pattern layer 30b is arranged in the second mark formation area R2 of another corner portion of the wiring substrate 1.

Like the electrode pads P, the side surfaces and lower surfaces of the first mark M1 and the second mark M2 (the first and second insulation pattern layers 30a, 30b) are embedded in the first insulation layer 31 with the upper surfaces thereof being exposed from the first insulation layer 31.

Also, likewise, the upper surfaces of the first mark M1 and the second mark M2 (the first and second insulation pattern layers 30a, 30b) and the upper surface of the first insulation layer 31 are arranged at the same height with being flush with each other. The first mark M1 and the second mark M2 are embedded up to a middle portion in the thickness direction of the first insulation layer 31, and the first insulation layer 31 exists at lower side of the first mark M1 and the second mark M2.

The thickness of the electrode pads P and each thickness of the first mark M1 and the second mark M2 are set to be the same.

FIG. 13 is a reduced plan view of the wiring substrate 1 shown in FIG. 12, as seen from above. The sectional view of FIG. 12 corresponds to a section taken along a line I-I of FIG. 13.

Referring to the reduced plan view of FIG. 13, a number "1" for identification is arranged as the first mark M1 of the wiring substrate 1. Also, a symbol "⊙" for alignment is arranged as the second mark M2 of the wiring substrate 1.

The first mark M1 and the second mark M2 are formed of an insulating resin, which includes dyestuffs taking on various colors. The color of the first mark M1 and the second mark M2 is green, red, blue or black, for example.

A wavelength range of the visible light which is to be reflected on the green color is 495 nm to 570 nm. A wavelength range of the visible light which is to be reflected on the red color is 620 nm to 750 nm. A wavelength range of the visible light which is to be reflected on the blue color is 450 nm to 495 nm. In the case of the black color, a light absorptivity of the visible light having a wavelength of 380 nm to 780 nm is 70% or greater.

On the other hand, the first insulation layer 31 is formed of an insulating resin, which does not include dyestuff. The first insulation layer 31 has a white, cream (faint yellow) or transparent color, for example. A wavelength range of the visible light which is to be reflected on the white color is 380 nm to 780 nm.

Alternatively, the first mark M1 and the second mark M2 may be formed of an insulating resin, which does not include dyestuff, and the first insulation layer 31 may be formed of an insulating resin, which includes dyestuff. Further, the first mark M1 and the second mark M2 may be formed of an insulating resin including dyestuff, and the first insulation layer 31 may be formed of an insulating resin including dyestuff. In this case, the kind of dyestuff included in the first mark M1 and the second mark M2 is different from the kind of dyestuff included in the first insulation layer 31, or the amount of dyestuff included in the first mark M1 and the second mark M2 is different from the amount of dyestuff included in the first insulation layer 31. Furthermore, instead of dyestuff, fillers can be used. Further, one of the first and second marks M1, M2 and the first insulation layer 31 may be formed of an insulating resin including dyestuff, and the other of the first and second marks M1, M2 and the first insulation layer 31 may be formed of an insulating resin including fillers.

In this way, the color of the first mark M1 and the second mark M2 (the first and second insulation pattern layers 30a, 30b) and the color of the first insulation layer 31 are different. Thereby, it is possible to recognize outward shapes of the first mark M1 and the second mark M2.

The configuration where the colors are different between the first mark M1 and second mark M2 and the first insulation layer 31 means that the light absorptivity and reflectivity are different therebetween.

The light absorptivity and reflectivity may be set to be different between the first mark M1 and second mark M2 and the first insulation layer 31 so that they can be recognized with an image recognition device although they cannot be recognized with human's eyes.

Also, again referring to FIG. 12, the first insulation layer 31 is formed with the first via-holes VH1 reaching the electrode pads P from the lower surface-side thereof. The second wiring layer 22 connected to the electrode pads P through the via-conductors in the first via-holes VH1 is formed on a lower surface of the first insulation layer 31.

In the first exemplary embodiment, the first and second marks M1, M2 formed by the first and second insulation pattern layers 30a, 30b are embedded and arranged in the first insulation layer 31 of the first and second mark formation areas R1, R2. Thereby, it is possible to arrange the second wiring layer 22 not only in the component mounting area B but also on the lower surface of the first insulation layer 31 of the first and second mark formation areas R1, R2.

In this way, it is possible to effectively use the lower surface of the first insulation layer 31 of the first and second mark formation areas R1, R2, as a formation area of a wiring layer for establishing an electric circuit thereon. Therefore, a circuit design of the wiring substrate is not limited, and it is possible to improve a degree of freedom of the circuit design.

Furthermore, since the first and second marks M1, M2 are formed by the first and second insulation pattern layers 30a, 30b having a predetermined color, it is not necessary to change the material of the first and second marks M1, M2 even though a wiring substrate of a different type is manufactured, so that the color tone does not change. Therefore, it is possible to stably recognize the various marks of the wiring substrate without performing a troublesome adjustment operation for an image recognition device.

Also, likewise, the second insulation layer 32 having the second via-holes VH2 reaching the second wiring layer 22 is formed on a lower surface of the first insulation layer 31. Likewise, the third wiring layer 23 connected to the second wiring layer 22 through the via-conductors in the second via-holes VH2 is formed on a lower surface of the second insulation layer 32.

Also, likewise, the third insulation layer 33 having the third via-holes VH3 reaching the third wiring layer 23 is formed on the lower surface of the second insulation layer 32. Likewise, the fourth wiring layer 24 connected to the third wiring layer 23 through the via-conductors in the third via-holes VH3 is formed on a lower surface of the third insulation layer 33.

Also, the protective insulation layer 34 having the openings 34a formed on the connection portions of the fourth wiring layer 24 is formed on the lower surface of the third insulation layer 33.

As shown in FIG. 9, when the first to third via-holes VH1 to VH3 of the build-up wiring layer BW are formed on the metal plate 10, the via-holes are formed to have a forward tapered shape of which a diameter of a bottom surface at the electrode pad P-side is smaller than a diameter of an opening end at the fourth wiring layer 24-side.

The wiring substrate 1 of FIG. 12 is obtained by vertically reversing the four-layered build-up wiring layer BW including the electrode pads P formed on the metal plate 10 of FIG. 10. For this reason, the first to third via-holes VH1 to VH3 (via-conductor) of the wiring substrate 1 shown in FIG. 12 have a circular truncated cone shape of which a side facing towards the electrode pad P is a bottom surface and which opens towards the fourth wiring layer 24.

The wiring substrate 1 of the first exemplary embodiment is manufactured as a careless substrate having no core substrate having a large thickness, and can be used as a mounting substrate of a high-performance semiconductor chip.

FIG. 14 depicts an electronic component device 2 of which a semiconductor chip is flip-chip connected to the wiring substrate 1 of the first exemplary embodiment.

As shown in FIG. 14, bump electrodes 42 of a semiconductor chip 40 are flip-chip connected to the electrode pads P in the component mounting area B of the wiring substrate 1 shown in FIG. 12 by soldering.

At this time, the semiconductor chip 40 is positionally aligned and mounted while image recognizing the symbol "⊚" arranged as a mark for alignment in the second mark formation area R2 of each product area A of the wiring substrate 1.

Also, since "1", "2", "3" . . . are arranged as identification numbers in the first mark formation areas R1 of the respective product areas A of the wiring substrate 1, when the wiring substrate 1 is cut and then determined as a defective product, it is possible to specify information, which indicates from which part of the large-scale metal plate 10 the corresponding piece substrate is obtained, so that it is possible to effectively perform the defective product analysis.

Also, an underfill resin 44 is filled between the semiconductor chip 40 and the wiring substrate 1.

Furthermore, the connection portions of the fourth wiring layer 24 on the lower surface of the wiring substrate 1 may be mounted with solder balls so as to provide external connection terminals.

The semiconductor chip 40 is an example of the electronic component, and an electronic component consisting of various active or passive elements can be used. Also, the semiconductor chip 40 and a passive element such as a capacitor may be mounted with being mixed.

(Second Exemplary Embodiment)

Figure 19:
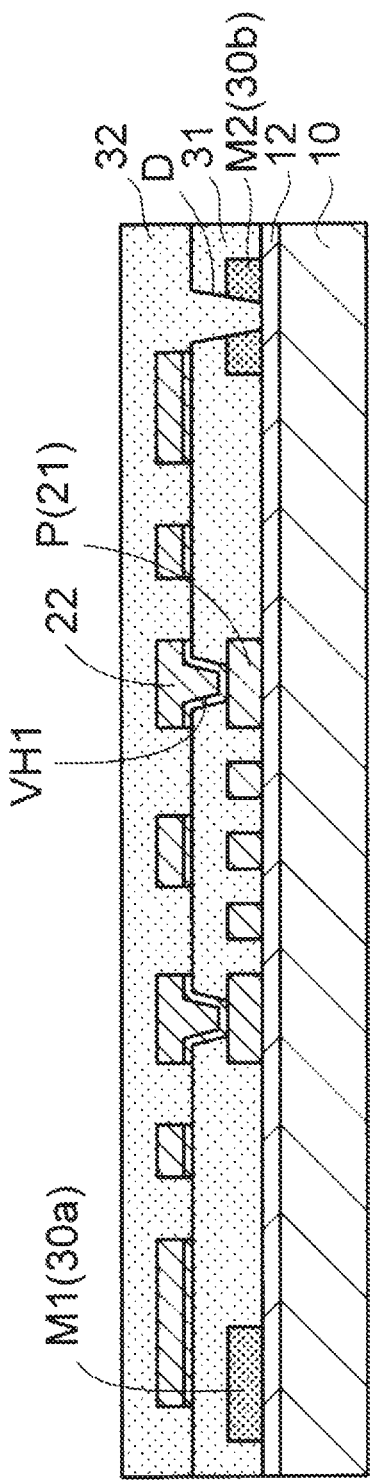
FIG. 19 is a sectional view depicting the manufacturing method of the wiring substrate of the second exemplary embodiment (5 thereof).
Figure 20:
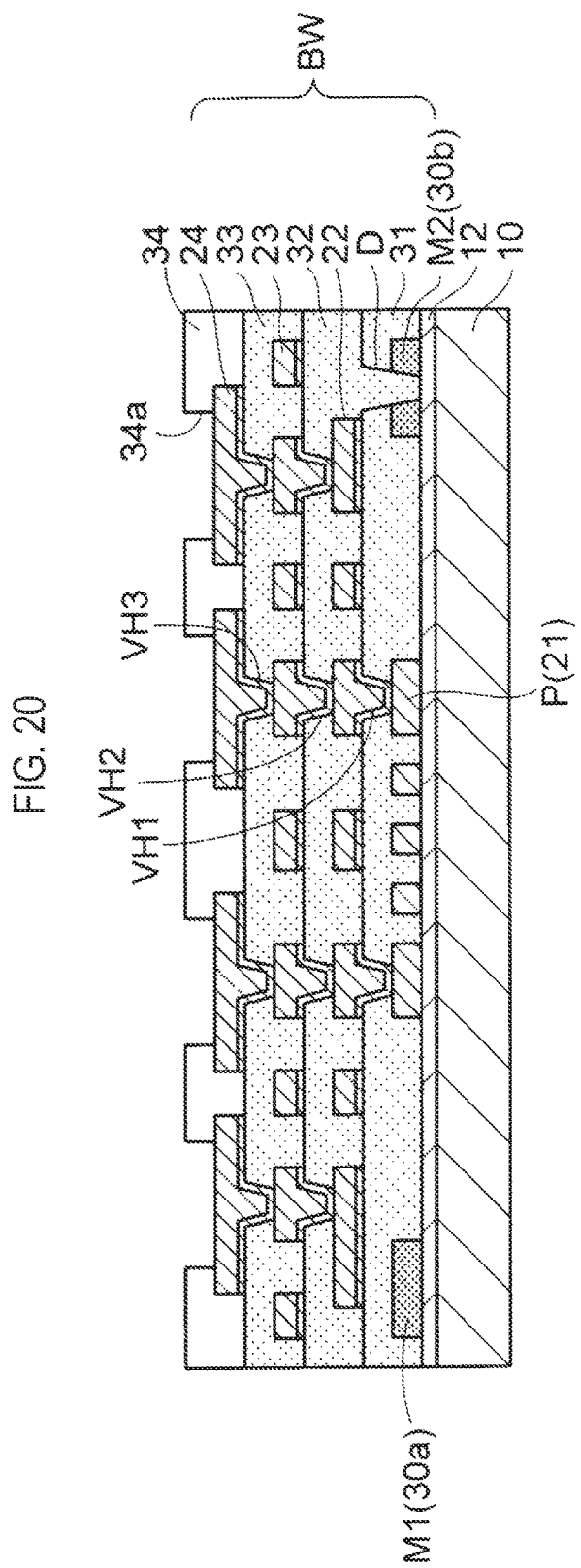
FIG. 20 is a sectional view depicting the manufacturing method of the wiring substrate of the second exemplary embodiment (6 thereof).
Figure 21:
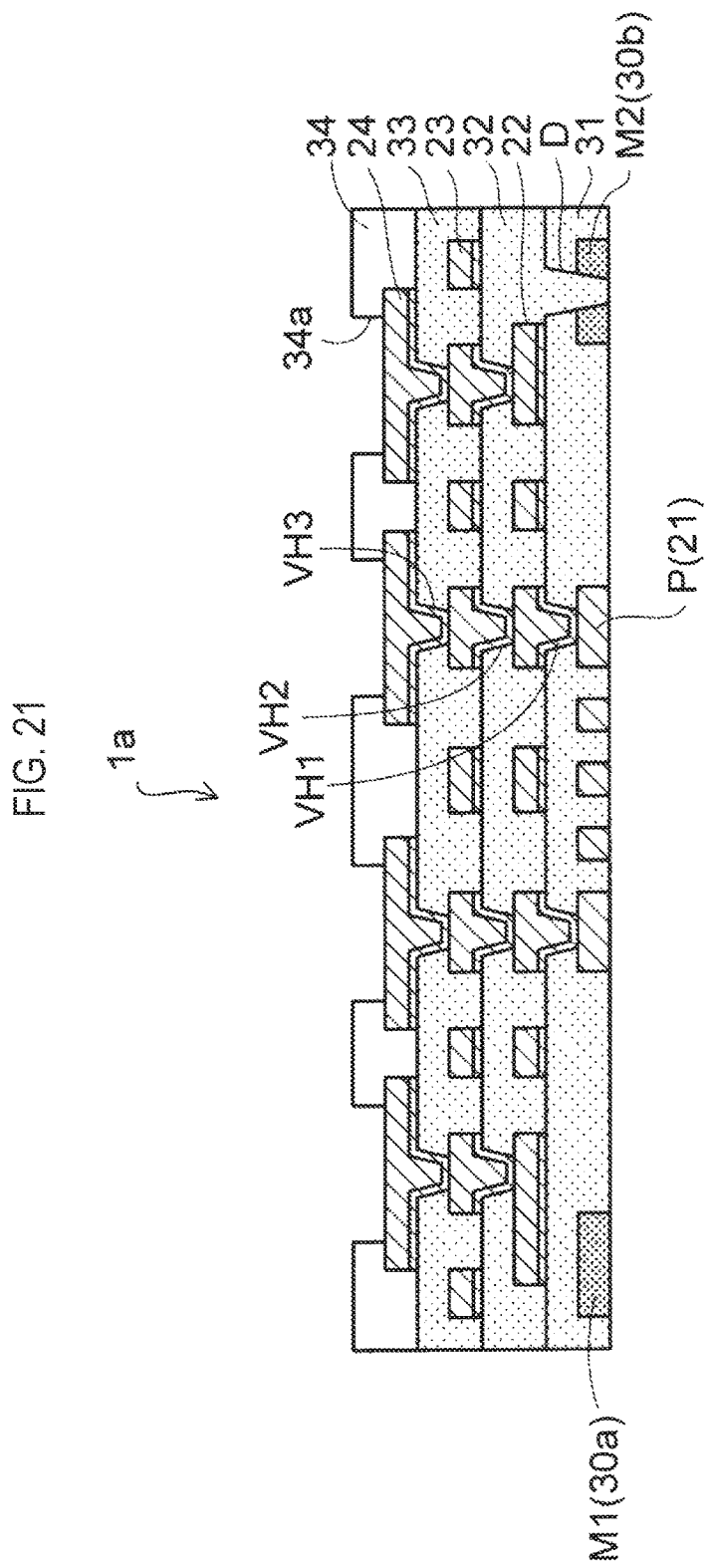
FIG. 21 is a sectional view depicting a wiring substrate of the second exemplary embodiment (1 thereof).
Figure 22:
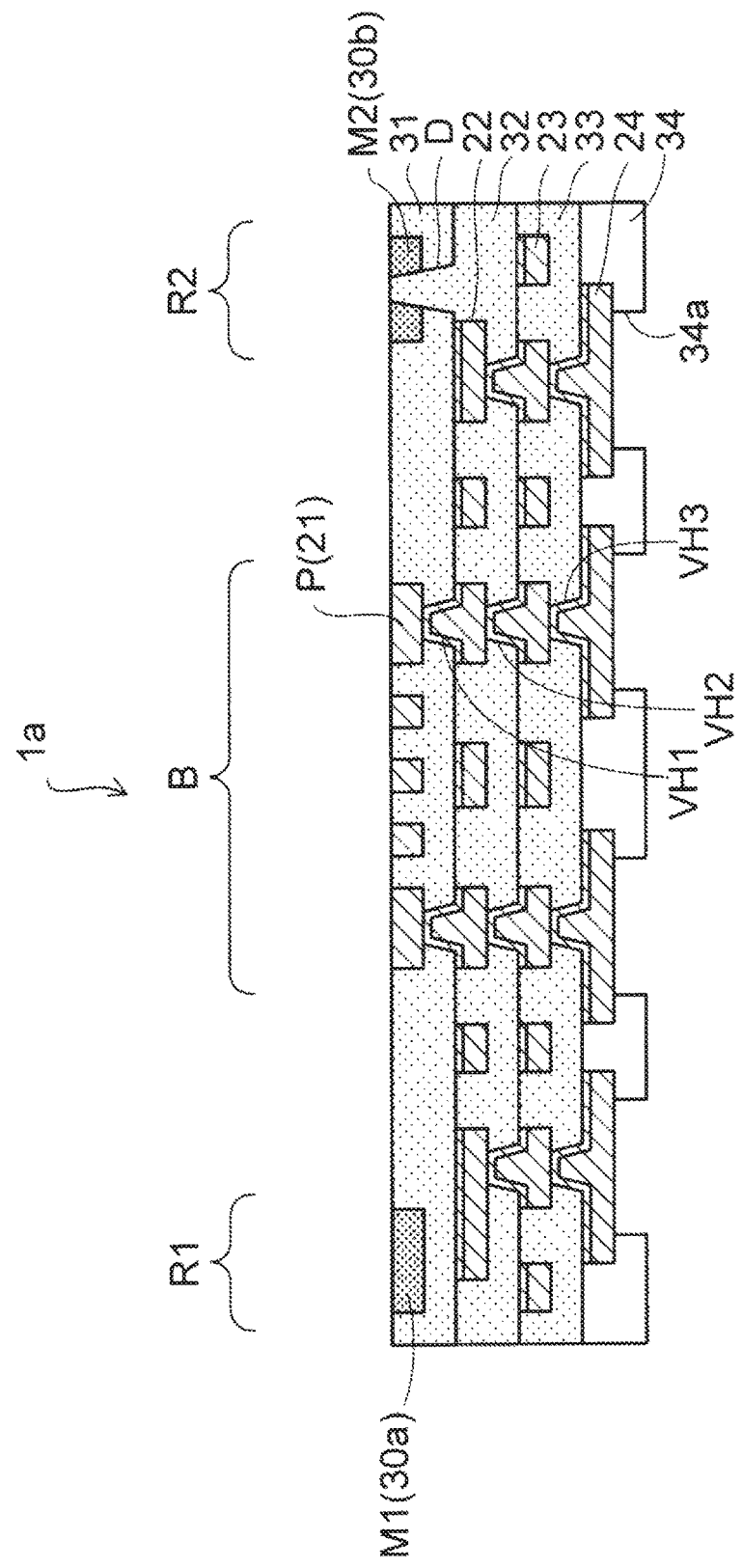
FIG. 22 is a sectional view depicting the wiring substrate of the second exemplary embodiment (2 thereof).

FIGS. 15A to 20 illustrate a manufacturing method of a wiring substrate of a second exemplary embodiment, FIGS. 21 and 22 illustrate a wiring substrate of the second exemplary embodiment, and FIG. 23 depicts an electronic component device of the second exemplary embodiment.

In the second exemplary embodiment, a shape of a mark, which is finally recognized in a plan view, is the same as the first exemplary embodiment. However, a manufacturing method thereof and a structure around the mark are different. In the second exemplary embodiment, the detailed descriptions of the same elements and similar processes as and to the first exemplary embodiment are omitted.

Figure 15A:
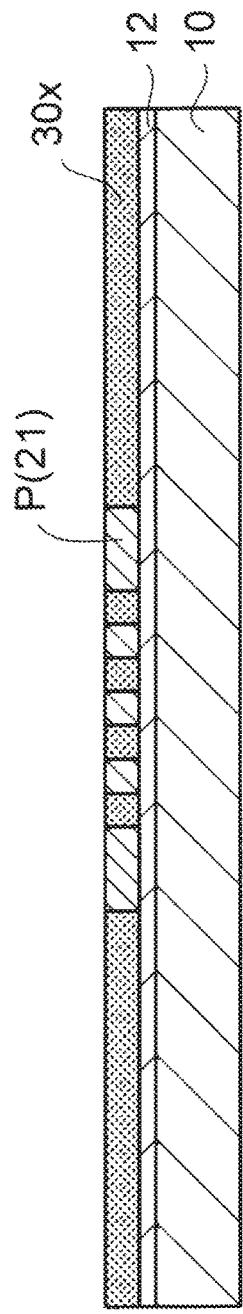
FIGS. 15A and 15B are sectional views depicting a manufacturing method of a wiring substrate of a second exemplary embodiment (1 thereof).
Figure 15B:
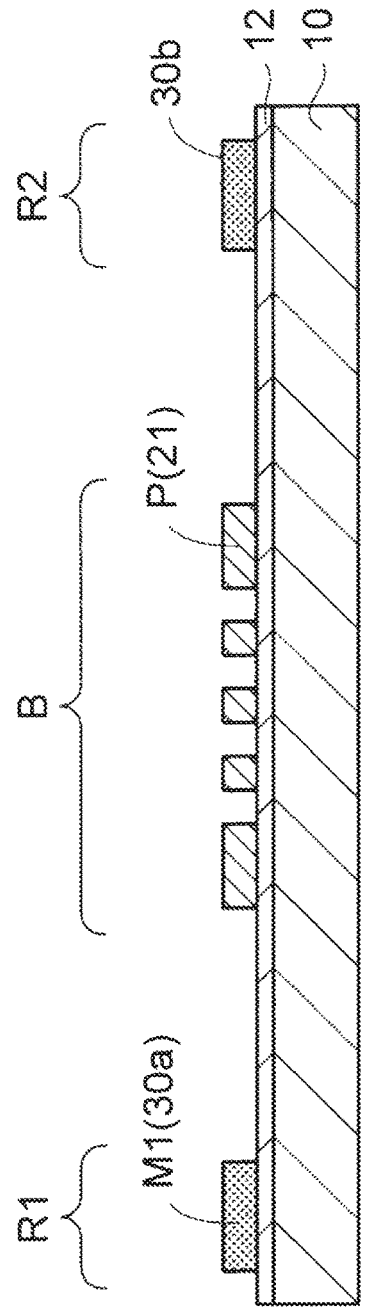

In the manufacturing method of the wiring substrate of the second exemplary embodiment, first, as shown in FIG. 15A, the same structure as FIG. 3B of the first exemplary embodiment is prepared. Also, as shown in FIG. 15B, like the process of FIG. 4A, the photosensitive insulating resin layer 30x is patterned by the photolithography, so that the first and second insulation pattern layers 30a, 30b are formed.

At this time, in the second exemplary embodiment, the first mark M1 consisting of the number "1", which is the same as the first exemplary embodiment, is arranged in the first mark formation area R1. The first mark M1 is formed by the first insulation pattern layer 30a.

Meanwhile, the second insulation pattern layer 30b having a circular shape on the way of the formation of the second mark is arranged in the second mark formation area R2.

Then, as shown in FIG. 16A, like the process of FIG. 5B, the first insulation layer 31 covering the electrode pads P, the first mark M1 and the second insulation pattern layer 30b is formed on the metal plate 10.

Also, as shown in FIG. 16B, the first insulation layer 31 is subjected to the laser processing, so that the first via-holes VH1 reaching the electrode pads P are formed. At the same time, a portion of the first insulation layer 31 on the second insulation pattern layer 30b arranged in the second mark formation area R2 is subjected to the laser processing and the center of the second insulation pattern layer 30b is penetrated by the laser. Thereby, the first insulation layer 31 and the second insulation pattern layer 30b are formed with an opening D penetrating in a thickness direction.

As a result, as seen from a plan view, the second insulation pattern layer 30b having the opening D arranged at the center thereof is obtained, and the second mark M2 consisting of the symbol "⊚" for alignment is formed.

Then, as shown in FIG. 17A, the seed layer 22a is formed on respective sidewalls of the first via-holes VH1 and opening D and the upper surface of the first insulation layer 31. At this time, the seed layer 22a is formed on the sidewalls of the opening D of the first insulation layer 31 and the second mark M2, too.

Also, as shown in FIG. 17B, the plated resist layer 15 having openings 15a formed in the area of the second wiring layer 22 is formed on the seed layer 22a. At this time, the opening D of the first insulation layer 31 and the second mark M2 is blocked by the plated resist layer 15.

Figure 18A:
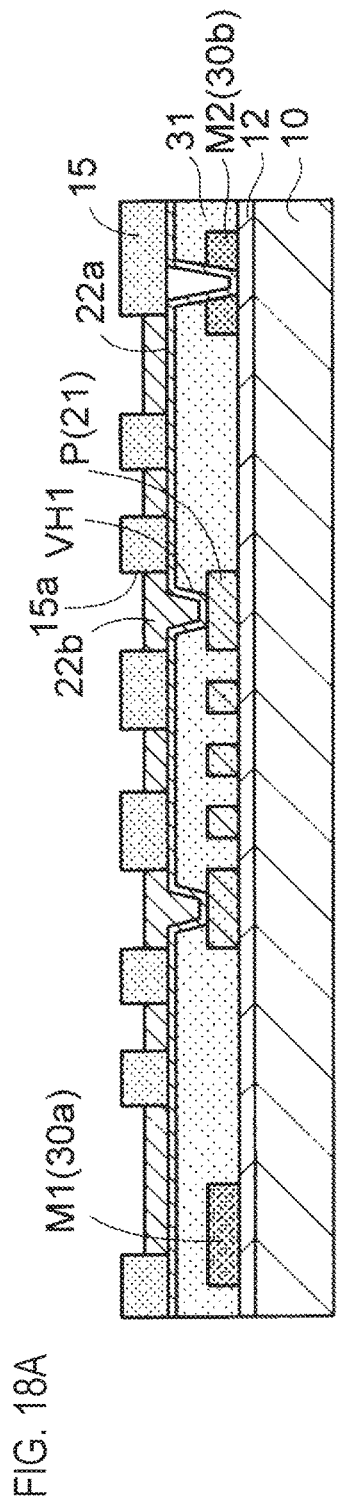
FIGS. 18A and 18B are sectional views depicting the manufacturing method of the wiring substrate of the second exemplary embodiment (4 thereof).

Subsequently, as shown in FIG. 18A, the metal plated layer 22b is formed to fill the first via-holes VH1 and the openings 15a of the plated resist layer 15 by an electrolytic plating method in which the seed layer 22a is used as a plating power feeding path.

Figure 18B:
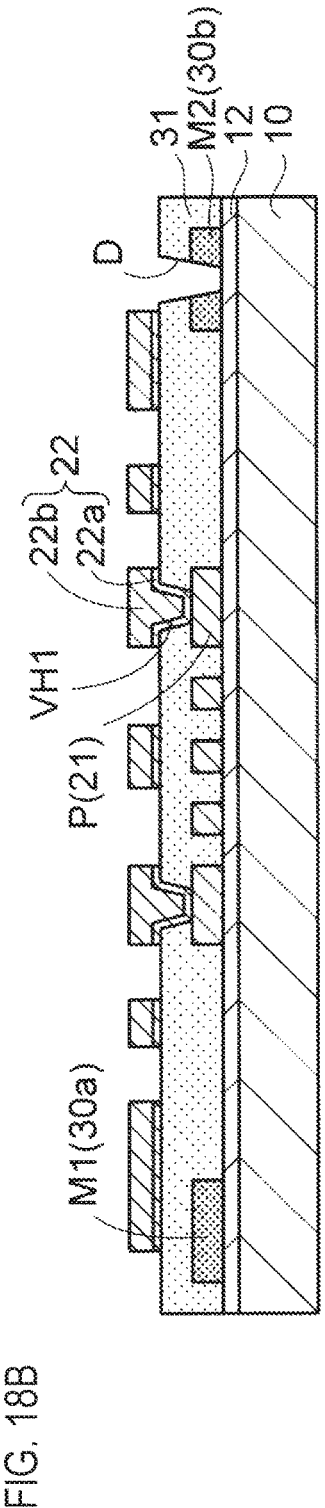

Also, as shown in FIG. 18B, the plated resist layer 15 is removed, and the seed layer 22a is then etched using the metal plated layer 22b as a mask.

By the above processes, the second wiring layer 22 is formed by the seed layer 22a and the metal plated layer 22b. At this time, the seed layer 22a formed on the sidewall of the opening D of the first insulation layer 31 and the second mark M2 is also simultaneously removed.

Then, as shown in FIG. 19, the second insulation layer 32 covering the second wiring layer 22 is formed on the first insulation layer 31. At this time, the opening D of the first insulation layer 31 and the second mark M2 is filled and flattened by the second insulation layer 32.

Subsequently, the processes, which are similar to the processes from the process of forming the second via-holes VH2 of FIG. 8 to the process of forming the protective insulation layer 34 of FIG. 9 in the first exemplary embodiment, are performed. Thereby, as shown in FIG. 20, a four-layered build-up wiring layer BW including the electrode pads P at the lowest layer is formed on the metal plate 10 with the nickel layer 12 being interposed therebetween.

Also, as shown in FIG. 21, the metal plate 10 and the nickel layer 12 are removed from the structure of FIG. 20. Thereby, a wiring substrate 1a of the second exemplary embodiment is obtained.

FIG. 22 depicts a state where the wiring substrate 1a of FIG. 21 is reversed in the upper and lower direction.

The wiring substrate 1a of FIG. 22 is different from the wiring substrate 1 of FIG. 12 of the first exemplary embodiment, in terms of a structure around the second mark M2 arranged in the second mark formation area R2.

In the wiring substrate 1 of FIG. 12 of the first exemplary embodiment, an opening is not formed in the first insulation layer 31 below the second mark M2, and the opening penetrating in the thickness direction is formed only in the second mark M2. The first insulation layer 31 is embedded in the opening of the second mark M2.

In this way, in the second mark M2 of the first exemplary embodiment, the first insulation layer 31 is embedded in the opening of the second insulation pattern layer 30b.

On the other hand, in the second exemplary embodiment, as shown in FIG. 22, the first insulation layer 31 and the second mark M2 (second insulation pattern layer 30b) are formed with the opening D penetrating in the thickness direction. The second insulation layer 32 arranged on the lower surface of the first insulation layer 31 is embedded in the opening D of the first insulation layer 31 and the second mark M2. The second insulation layer 32 covers the second wiring layer 22.

In this way, in the second mark M2 of the second exemplary embodiment, the second insulation layer 32 is embedded in the opening D of the second insulation pattern layer 30b.

For this reason, in the second mark formation area R2 of the wiring substrate 1a of the second exemplary embodiment, the second mark M2, the first insulation layer 31 and the second insulation layer 32 are exposed. The color of the second mark M2 (the second resin pattern layer 30b) and the colors of the first insulation layer 31 and the second insulation layer 32 are different, so that the second mark M2 can be recognized.

The color of the first insulation layer 31 and the color of the second insulation layer 32 are set to be the same. Alternatively, the color of the first insulation layer 31 and the color of the second insulation layer 32 may be set to be different from each other.

When the color of the first insulation layer 31 and the color of the second insulation layer 32 are set to be different from each other, it is possible to change the colors between the outer area of the second mark M2 and the opening D of the second mark M2.

Also, like the first exemplary embodiment, the second wiring layer 22 can be arranged not only in the component mounting area B but also on the lower surface of the first insulation layer 31 of the first and second mark formation areas R1, R2.

The wiring substrate 1a of the second exemplary embodiment has the effects similar to the wiring substrate 1 of the first exemplary embodiment.

Then, as shown in FIG. 23, the bump electrodes 42 of the semiconductor chip 40 are flip-chip connected to the electrode pads P of the wiring substrate 1a of FIG. 22 by soldering. Also, an underfill resin 44 is filled between the semiconductor chip 40 and the wiring substrate 1a.

Thereby, an electronic component device 2a of the second exemplary embodiment is obtained.

(Third Exemplary Embodiment)

Figures 25A, 25B:
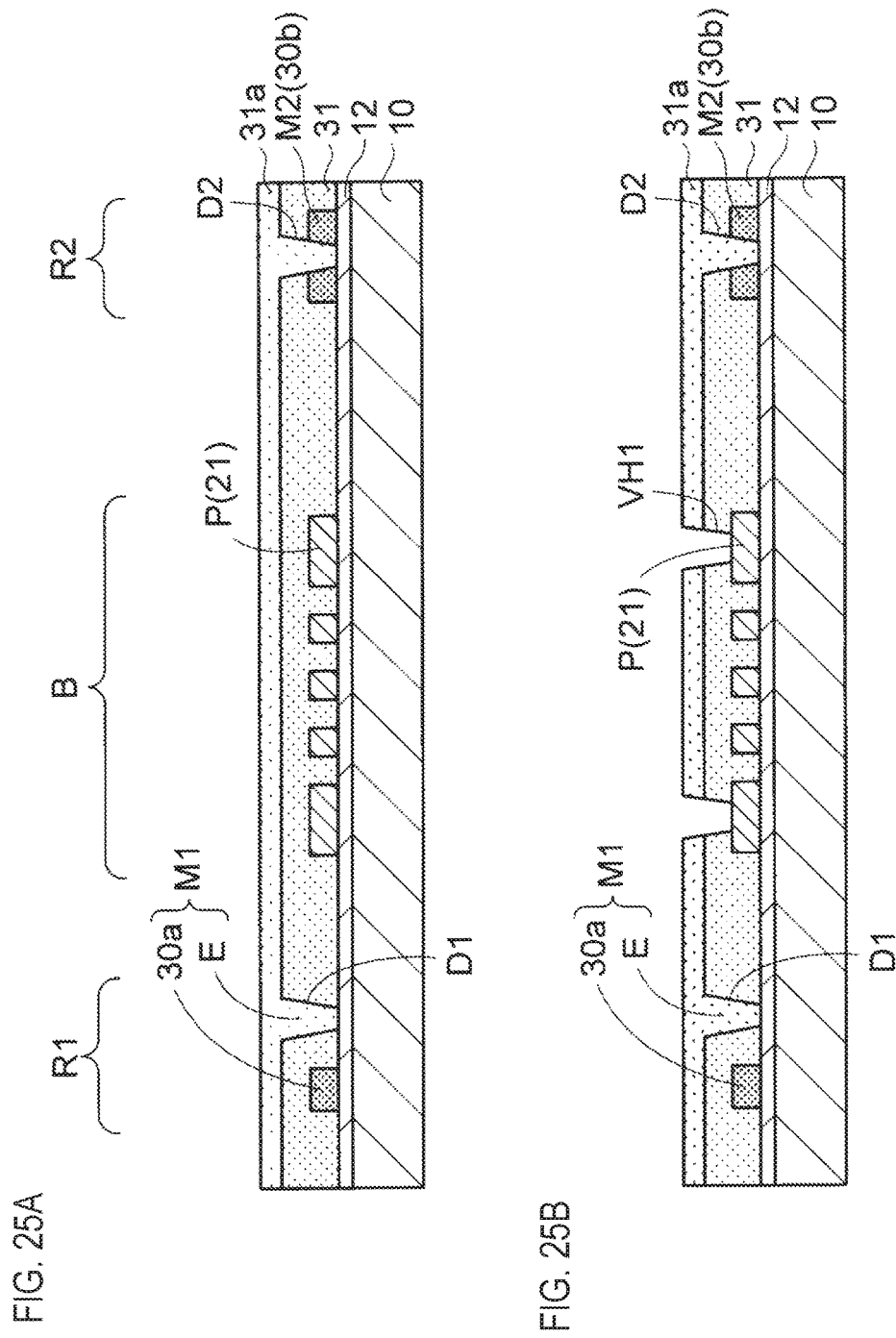
FIGS. 25A and 25B are sectional views depicting the manufacturing method of the wiring substrate of the third exemplary embodiment (2 thereof).
Figure 26:
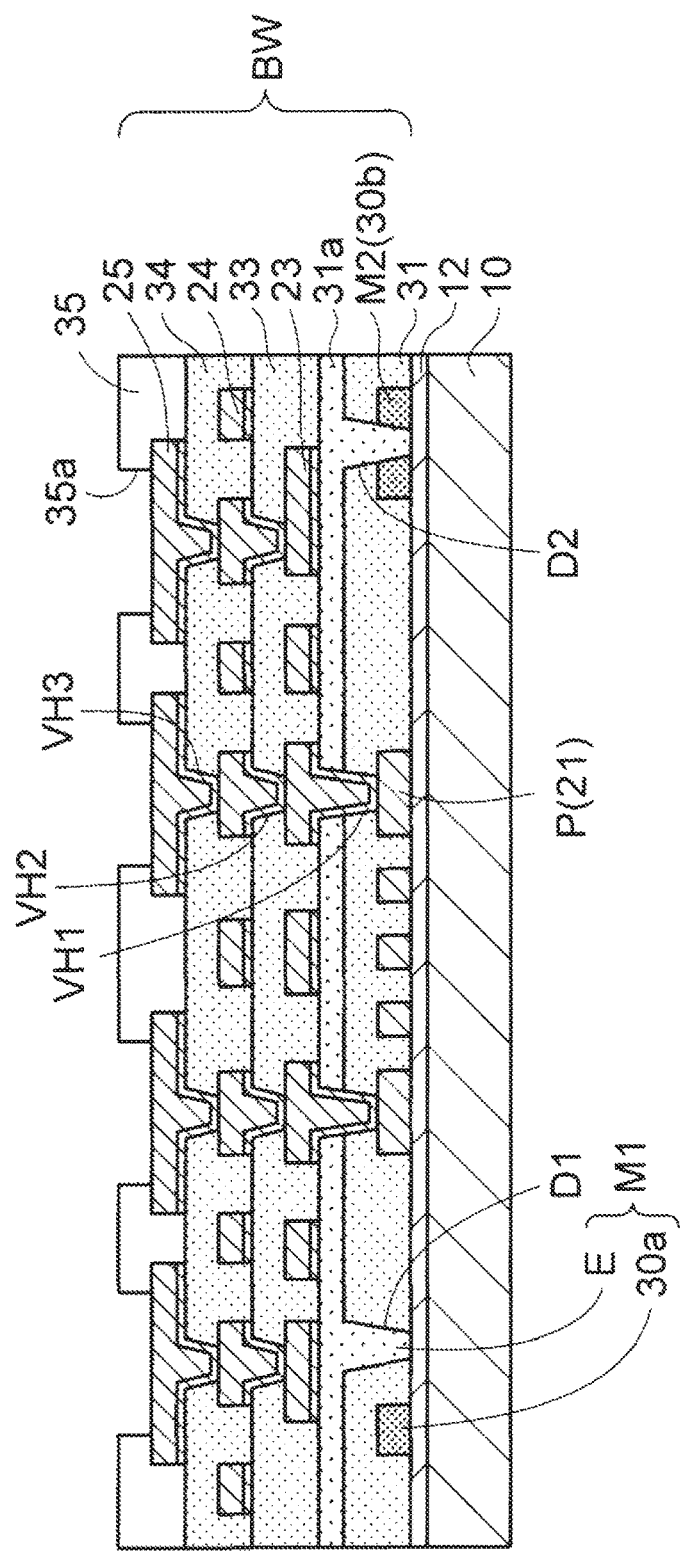
FIG. 26 is a sectional view depicting the manufacturing method of the wiring substrate of the third exemplary embodiment (3 thereof).
Figure 27:
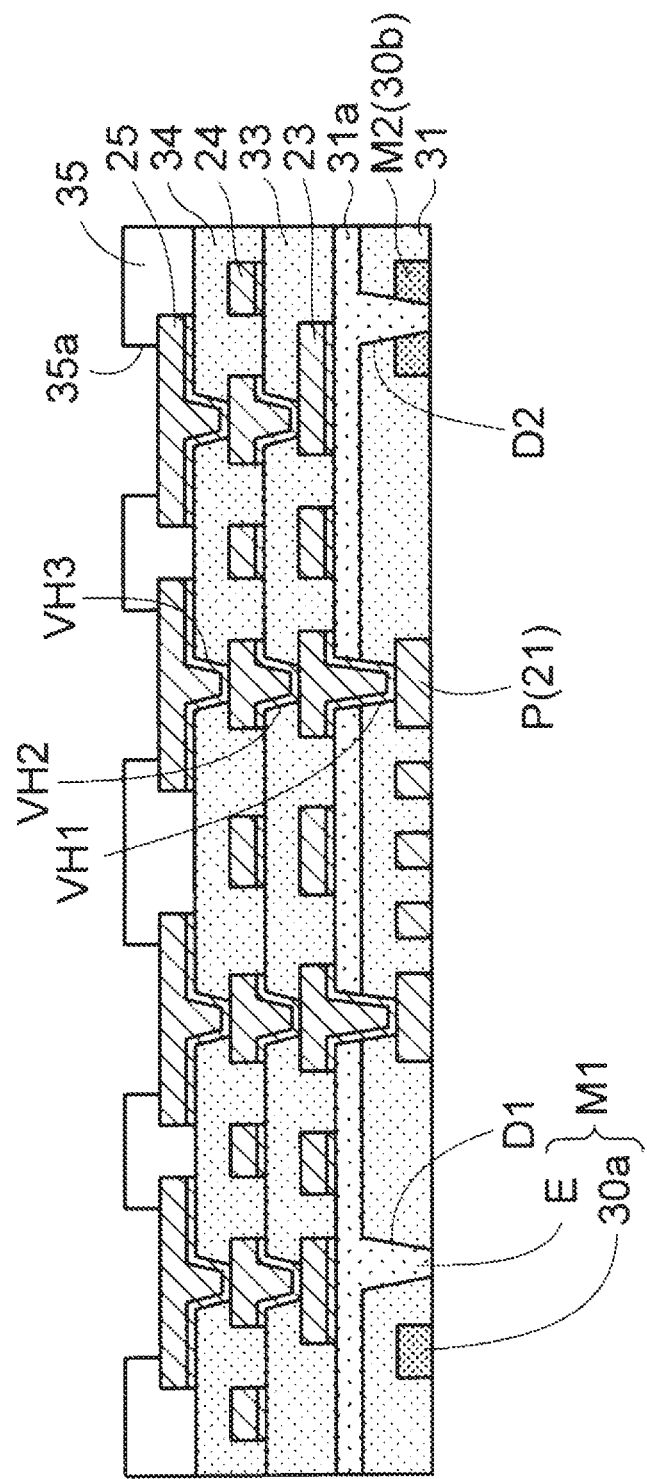
FIG. 27 is a sectional view depicting a wiring substrate of the third exemplary embodiment (1 thereof).
Figure 28:
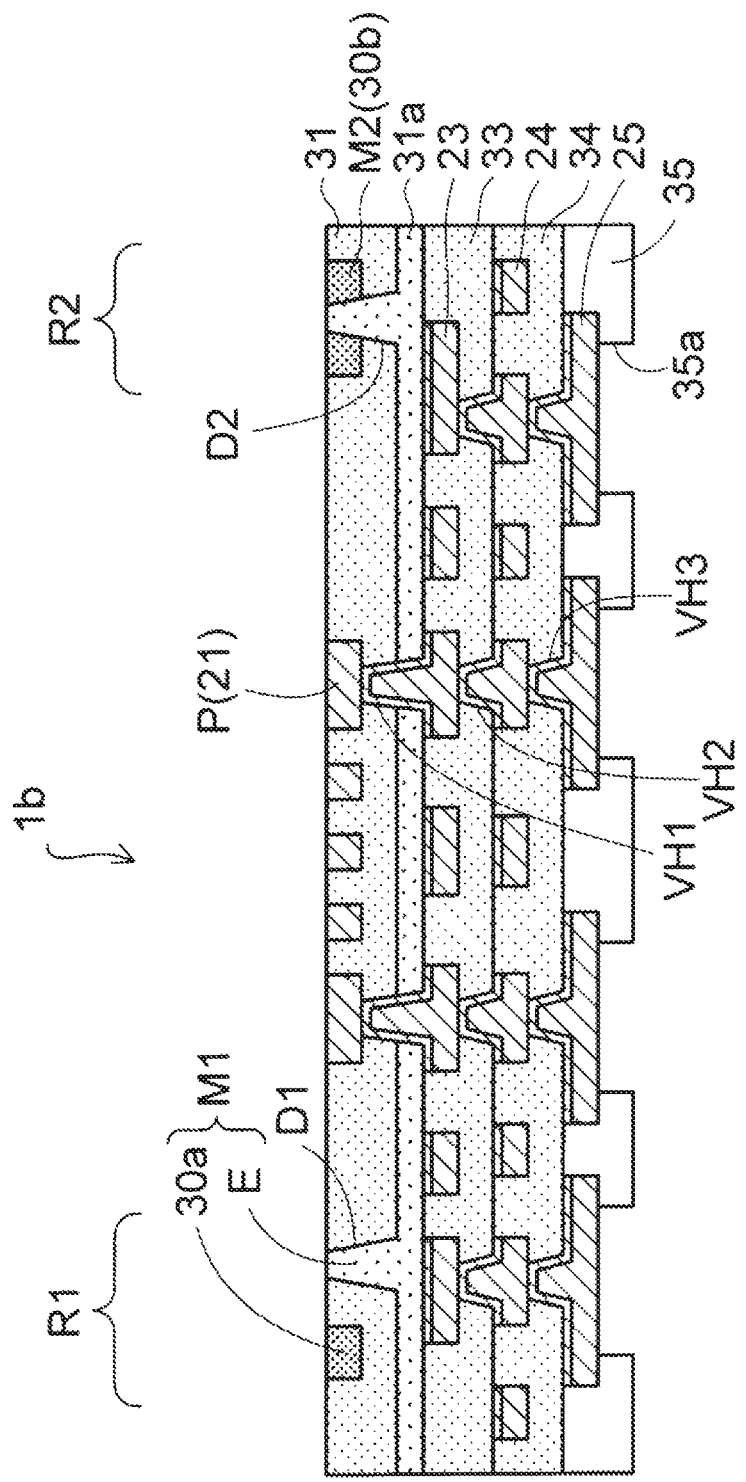
FIG. 28 is a sectional view depicting the wiring substrate of the third exemplary embodiment (2 thereof).

FIGS. 24A to 26 illustrate a manufacturing method of a wiring substrate of a third exemplary embodiment, and FIGS. 27 and 28 illustrate a wiring substrate of the third second exemplary embodiment.

The third exemplary embodiment is different from the first and second exemplary embodiments, in that a mark is formed in the first mark formation area by combining any number of insulating resins having different colors. In the third exemplary embodiment, the detailed descriptions of the same elements and similar processes as and to the first and second exemplary embodiments are omitted.

In the manufacturing method of the wiring substrate of the third exemplary embodiment, as shown in FIG. 24A, a structure similar to FIG. 5A of the first exemplary embodiment is first prepared. In the third exemplary embodiment, three types of insulating resins having different colors are arranged in the first mark formation area R1 of FIG. 24A.

For this reason, in this process, the first insulation pattern layer 30a, which is a part of the first mark, is arranged in the first mark formation area R1 of FIG. 24A. Also, the second insulation pattern layer 30b having a circular shape is arranged in the second mark formation area R2, like the second exemplary embodiment.

Then, the first insulation layer 31 covering the electrode pads P, the first insulation pattern layer 30a and the second insulation pattern layer 30b is formed on the metal plate 10. The colors of the first insulation pattern layer 30a and second insulation pattern layer 30b and the color of the first insulation layer 31 are different.

Then, as shown in FIG. 24B, the first insulation layer 31 is subjected to the laser processing, so that a first opening D1 penetrating in the thickness direction is formed in the first insulation layer 31 of an area adjacent to the first insulation pattern layer 30a of the first mark formation area R1.

Also, in the second mark formation area R2, a second opening D2 penetrating from the upper surface of the first insulation layer 31 to the lower surface of the second insulation pattern layer 30b is formed like the process of FIG. 16B of the second exemplary embodiment. Thereby, the second mark M2 similar to FIG. 16B of the second exemplary embodiment is formed.

Subsequently, as shown in FIG. 25A, an auxiliary insulation layer 31a is formed on the first insulation layer 31. The auxiliary insulation layer 31a is formed with filling the first opening D1 of the first insulation layer 31 and second opening D2 of the first insulation layer 31 and the second insulation pattern layer 30b. At this time, an upper surface of the auxiliary insulation layer 31a is formed to be flat.

Thereby, in the first mark formation area R1, an embedded portion E of the auxiliary insulation layer 31a embedded in the first opening D1 of the first insulation layer 31 becomes a part of the first mark. A color of the auxiliary insulation layer 31a is different from the color of the first insulation layer 31.

In this way, in the first mark formation area R1, the three types of the first insulation pattern layer 30a, the first insulation layer 31 and the auxiliary insulation layer 31a of which colors are different are arranged on the metal plate 10.

In the third exemplary embodiment, the first insulation pattern layer 30a, the second insulation pattern layer 30b and the auxiliary insulation layer 31a are formed of the insulating resins including dyestuff, and the first insulation layer 31 is formed of the insulating resin, which does not include dyestuff.

Alternatively, the first insulation pattern layer 30a, the second insulation pattern layer 30b and the auxiliary insulation layer 31a may be formed of the insulating resins, which do not include dyestuff, and the first insulation layer 31 may be formed by the insulating resin including dyestuff. Further, the first insulation pattern layer 30a, the second insulation pattern layer 30b and the auxiliary insulation layer 31a may be formed of insulating resins, which include dyestuff, and the first insulation layer 31 may be formed of an insulating resin including dyestuff. In this case, the kind of dyestuff included in the first insulation pattern layer 30a, the second insulation pattern layer 30b and the auxiliary insulation layer 31a is different from the kind of dyestuff included in the first insulation layer 31, or the amount of dyestuff included in the first insulation pattern layer 30a, the second insulation pattern layer 30b and the auxiliary insulation layer 31a is different from the amount of dyestuff included in the first insulation layer 31. Furthermore, instead of dyestuff, fillers can be used. Further, one of the first insulation pattern layer 30a (also the second insulation pattern layer 30b and the auxiliary insulation layer 31) and the first insulation layer 31 may be formed of an insulating resin including dyestuff, and the other of the first insulation pattern layer 30a, (also the second insulation pattern layer 30b and the auxiliary insulation layer 31) and the first insulation layer 31 may be formed of an insulating resin including fillers.

The colors of the first insulation pattern layer 30a, the first insulation layer 31 and the auxiliary insulation layer 31a are preferably different from each other.

By the above processes, the three types of the first insulation pattern layer 30a, the first insulation layer 31 and the auxiliary insulation layer 31a of which colors are different are arranged in the first mark formation area R1. The first mark M1 is formed by the first insulation pattern layer 30a and the embedded portion E of the auxiliary insulation layer 31a embedded in the first opening D1 of the first insulation layer 31. The first mark M1 may also be formed, including a part of the first insulation layer 31 in the first mark formation area R1.

In particular, although not shown, after the process of FIG. 25A, an opening penetrating the auxiliary insulation layer 31a and the first insulation layer 31 may be further formed in an area adjacent to the first opening D1 of the first insulation layer 31. Then, the auxiliary insulation layer is again embedded in the opening. Thereby, it is possible to form a mark by four types of insulating materials of which colors are different.

In this way, in the third exemplary embodiment, it is possible to form the mark having three or more numbers of different colors by repeating the process of forming the opening in the insulation layer and embedding the auxiliary insulation layer in the opening.

When the manufacturing method of the third exemplary embodiment is adopted, it is possible to easily cope with a situation where a two-dimensional barcode or the like is formed to have a beautiful color or color tones are changed between the first mark and the second mark.

Then, as shown in FIG. 25B, the auxiliary insulation layer 31a and the first insulation layer 31 are subjected to the later processing, so that the first via-holes VH1 reaching the electrode pads P are formed.

Subsequently, the processes, which are similar to the processes from the process of forming the seed layer 22a of FIG. 6A to the process of forming the protective insulation layer 34 of FIG. 9 in the first exemplary embodiment, are performed. Thereby, as shown in FIG. 26, a four-layered build-up wiring layer BW including the electrode pads P at the lowest layer is formed on the metal plate 10 with the nickel layer 12 being interposed therebetween, like FIG. 9 of the first exemplary embodiment.

Thereafter, as shown in FIG. 27, the metal plate 10 and the nickel layer 12 are removed from the structure of FIG. 26.

By the above processes, as shown in FIG. 27, a wiring substrate 1b of the third exemplary embodiment is manufactured.

FIG. 28 depicts a state where the wiring substrate 1b of FIG. 27 is reversed in the upper and lower direction. As shown in FIG. 28, the wiring substrate 1b of the third exemplary embodiment is different from the wiring substrates 1, 1a of the first and second exemplary embodiments, in terms of the structure of the first mark M1 arranged in the first mark formation area R1.

In the first mark formation area R1 of the wiring substrate 1b of the third exemplary embodiment, the first opening D1 penetrating the first insulation layer 31 is formed in the area adjacent to the first insulation pattern layer 30a. The auxiliary insulation layer 31a arranged on the lower surface of the first insulation layer 31 is embedded in the first opening D1.

The first mark M1 is formed by the first insulation pattern layer 30a and the embedded portion E of the auxiliary insulation layer 31a embedded in the first opening D1 of the first insulation layer 31. Alternatively, the first mark M1 may be formed, including a part of the first insulation layer 31 of the first mark formation area R1 in the mark pattern.

The color of the first insulation pattern layer 30a, the color of the first insulation layer 31 and the color of the auxiliary insulation layer 31a are different.

In this way, in the third exemplary embodiment, it is possible to form the first mark M1 by the three types of insulating resins having different colors.

As described above, when the opening penetrating in the thickness direction is formed in the auxiliary insulation layer 31a and the first insulation layer 31 in the vicinity of the first opening D1 and the auxiliary insulation layer of a second layer is formed, it is possible to form the mark by the four types of insulating resins having different colors.

Like this, according to the manufacturing method of the wiring substrate of the third exemplary embodiment, it is possible to form the mark having any number of different types of colors.

Also, like the first and second exemplary embodiments, it is possible to arrange the second wiring layer 22 not only in the component mounting area B but also on the lower surface of the first insulation layer 31 in the first and second mark formation areas R1, R2.

The wiring substrate 1b of the third exemplary embodiment has the effects similar to the wiring substrate 1 of the first exemplary embodiment.

Also in the wiring substrate 1b of the third exemplary embodiment, like FIG. 14 of the first exemplary embodiment, the electronic component is flip-chip connected to the electrode pads P of the wiring substrate 1b, so that an electronic component device is established.

This disclosure further encompasses various exemplary embodiments, for example, described below.

1. A manufacturing method of a wiring substrate, the method comprising:
preparing a metal plate for which a component mounting area and a mark formation area are defined;
forming an electrode pad in the component mounting area on the metal plate;
forming a mark by arranging an insulation pattern layer in the mark formation area on the metal plate;
forming a first insulation layer covering the electrode pad and the mark on the metal plate; and
removing the metal plate,
wherein a color of the first insulation layer and a color of the insulation pattern layer are different.

2. The manufacturing method according to claim 1, further comprising, after the forming the first insulation layer and before the removing the metal plate,
forming a via-hole reaching the electrode pad in the first insulation layer; and
forming a wiring layer, which is connected to the electrode pad through a via-conductor in the via-hole, on the first insulation layer,
wherein in the forming the wiring layer, the wiring layer is arranged not only in the component mounting area but also in the mark formation area.

3. The manufacturing method according to claim 2, wherein in the forming the via-hole, an opening penetrating the first insulation layer and the insulation pattern layer in a thickness direction is formed,
wherein after the forming the wiring layer, a second insulation layer configured to cover the wiring layer and to fill the opening is formed on an upper surface of the first insulation layer, and
wherein the mark is formed by the insulation pattern layer having the opening.

4. The manufacturing method according to claim 1, further comprising, after the forming the first insulation layer and before the removing the metal plate,
forming an opening penetrating the first insulation layer in a thickness direction in an area adjacent to the insulation pattern layer; and
forming an auxiliary insulation layer configured to fill the opening on an upper surface of the first insulation layer,
wherein the mark is formed by the insulation pattern layer and the auxiliary insulation layer embedded in the opening, and
wherein the color of the insulation pattern layer, the color of the first insulation layer and a color of the auxiliary insulation layer are different.

What is claimed is:

1. A wiring substrate comprising:
a first insulation layer having a component mounting area and a mark formation area;
an electrode pad arranged in the component mounting area and having an upper surface exposed from the first insulation layer and a side surface and a lower surface embedded in the first insulation layer; and
a mark arranged in the mark formation area and formed of an insulation pattern layer having an upper surface exposed from the first insulation layer and a side surface and a lower surface embedded in the first insulation layer,
wherein a color of the first insulation layer and a color of the insulation pattern layer are different,
wherein the insulation pattern layer is formed by an insulating resin which includes dyestuff, and the first insulation layer is formed by an insulating resin which does not include dyestuff, and
wherein the color of the first insulation layer is cream, and the color of the insulation pattern layer is one of green, red, blue, and black.

2. The wiring substrate according to claim 1, further comprising:
a via-hole formed at a lower surface-side of the first insulation layer and reaching a lower surface of the electrode pad,
a via-conductor formed in the via-hole; and
a wiring layer formed on a lower surface of the first insulation layer and connected to the electrode pad through the via-conductor,
wherein the wiring layer is arranged not only in the component mounting area but also in the mark formation area.

3. The wiring substrate according to claim 1, further comprising:
an opening arranged in an area adjacent to the insulation pattern layer and penetrating the first insulation layer in a thickness direction; and
an auxiliary insulation layer formed on a lower surface of the first insulation layer and filling the opening,
wherein the mark is formed by the insulation pattern layer and the auxiliary insulation layer embedded in the opening, and
wherein the color of the insulation pattern layer, the color of the first insulation layer and a color of the auxiliary insulation layer are different.

4. A wiring substrate comprising:
a first insulation layer having a component mounting area and a mark formation area;
an electrode pad arranged in the component mounting area and having an upper surface exposed from the first insulation layer and a side surface and a lower surface embedded in the first insulation layer;
a mark arranged in the mark formation area and formed of an insulation pattern layer having an upper surface exposed from the first insulation layer and a side surface and a lower surface embedded in the first insulation layer;
a via-hole formed at a lower surface-side of the first insulation layer and reaching a lower surface of the electrode pad,
a via-conductor formed in the via-hole;
a wiring layer formed on a lower surface of the first insulation layer and connected to the electrode pad through the via-conductor an opening penetrating the first insulation layer and the insulation pattern layer in a thickness direction; and a second insulation layer formed on the lower surface of the first insulation layer and covering the wiring layer and filling the opening, wherein a color of the first insulation layer and a color of the insulation pattern layer are different, wherein the wiring layer is arranged not only in the component mounting area but also in the mark formation area, and wherein the mark is formed by the insulation pattern layer having the opening.

5. An electronic component device comprising:

the wiring substrate according to claim 4; and an electronic component connected to the electrode pad of the wiring substrate.

6. An electronic component device comprising:

a wiring substrate comprising:

a first insulation layer having a component mounting area and a mark formation area, an electrode pad arranged in the component mounting area and having an upper surface exposed from the first insulation layer and a side surface and a lower surface embedded in the first insulation layer, and a mark arranged in the mark formation area and formed of an insulation pattern layer having an upper surface exposed from the first insulation layer and a side surface and a lower surface embedded in the first insulation layer; and an electronic component connected to the electrode pad of the wiring substrate, wherein a color of the first insulation layer and a color of the insulation pattern layer are different, wherein the insulation pattern layer is formed by an insulating resin which includes dyestuff, and the first insulation layer is formed by an insulating resin which does not include dyestuff, and wherein the color of the first insulation layer is cream, and the color of the insulation pattern layer is one of green, red, blue, and black.

\* \* \* \* \*